US012757443B2

(12) United States Patent
Chung et al.

(10) Patent No.: US 12,757,443 B2
(45) Date of Patent: Oct. 6, 2026

(54) SEMICONDUCTOR DEVICE

(71) Applicant: Samsung Electronics Co., Ltd., Suwon-si (KR)

(72) Inventors: Won Keun Chung, Suwon-si (KR); Geun Woo Kim, Suwon-si (KR); Jun Ki Park, Suwon-si (KR); Wan Don Kim, Suwon-si (KR); Hyo Seok Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 408 days.

(21) Appl. No.: 18/441,269

(22) Filed: Feb. 14, 2024

(65) Prior Publication Data

US 2025/0063763 A1 Feb. 20, 2025

(30) Foreign Application Priority Data

Aug. 14, 2023 (KR) ........................ 10-2023-0106222

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01);
(Continued)

(58) Field of Classification Search
CPC ............. H10D 30/014; H10D 30/6729; H10D 30/6735; H10D 30/6757; H10D 64/01; H10D 64/62; H10W 20/427
See application file for complete search history.

(56) References Cited

U.S. PATENT DOCUMENTS 11,233,005 B1 * 1/2022 Chen .................. H10D 30/6219
11,551,969 B2 * 1/2023 Yu ........................ H10D 30/797
(Continued)

FOREIGN PATENT DOCUMENTS

KR 10-2021-0120399 A 10/2021
KR 10-2021-0148543 A 12/2021
KR 10-2022-0162334 A 12/2022

*Primary Examiner* — Steven M Page
(74) *Attorney, Agent, or Firm* — Harness, Dickey & Pierce, P.L.C.

(57) ABSTRACT

A semiconductor device may include a backside wiring line in a first backside interlayer insulating film, a fin-type pattern on the backside wiring line, a second backside interlayer insulating film between the fin-type pattern and the first backside interlayer insulating film, a gate electrode on the fin-type pattern, a first source/drain pattern on a side of the gate electrode, and a backside source/drain contact in a backside contact hole defined by the fin-type pattern and the second backside interlayer insulating film. The backside source/drain contact may connect the backside wiring line and the first source/drain pattern. The backside source/drain contact may include an upper pattern and a lower pattern. The upper pattern may be between the lower pattern and the first source/drain pattern, and may fill at least a portion of the first backside contact hole. The upper pattern may have a single conductive film structure.

20 Claims, 33 Drawing Sheets

(51) Int. Cl.
*H10D 30/43* (2025.01)
*H10D 62/10* (2025.01)
*H10D 64/01* (2025.01)
*H10D 64/62* (2025.01)
*H10W 20/41* (2026.01)

(52) U.S. Cl.
CPC ..... *H10D 30/6735* (2025.01); *H10D 30/6757* (2025.01); *H10D 62/121* (2025.01); *H10D 64/01* (2025.01); *H10D 64/0112* (2026.01); *H10D 64/62* (2025.01); *H10W 20/427* (2026.01)

(56) References Cited

U.S. PATENT DOCUMENTS

| | | | | |
|---|---|---|---|---|
| 11,588,050 | B2 | 2/2023 | Yu et al. | |
| 2022/0093448 | A1* | 3/2022 | Yu | H10D 30/797 |
| 2022/0130970 | A1* | 4/2022 | Kang | H10D 64/258 |
| 2022/0165659 | A1 | 5/2022 | Huang et al. | |
| 2023/0093101 | A1 | 3/2023 | Xie et al. | |

* cited by examiner

SEMICONDUCTOR DEVICE

CROSS-REFERENCE TO RELATED APPLICATION

This application claims priority from Korean Patent Application No. 10-2023-0106222, filed on Aug. 14, 2023 in the Korean Intellectual Property Office, and all the benefits accruing therefrom under 35 U.S.C. 119, the entire contents are herein incorporated by reference.

BACKGROUND

1. Technical Field

The present disclosure relates to a semiconductor device.

2. Description of the Related Art

As one of the scaling technologies for increasing a density of semiconductor devices, a multi-gate transistor in which a multi-channel active pattern (or silicon body) having a fin or nanowire shape is formed on a substrate and a gate is formed on a surface of the multi-channel active pattern has been proposed.

Since such a multi-gate transistor uses a three-dimensional channel, it is easy to perform scaling. In addition, it is possible to improve current control capability even without increasing a length of the gate of the multi-gate transistor. In addition, it is possible to effectively suppress a short channel effect (SCE) in which a potential of a channel region is affected by a drain voltage.

Meanwhile, as a pitch size of the semiconductor device decreases, research for reducing capacitance and securing electrical stability between contacts in the semiconductor device may be required.

SUMMARY

Aspects of the present disclosure provide a semiconductor device capable of improving performance and reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a semiconductor device may include a first backside interlayer insulating film; a backside wiring line in the first backside interlayer insulating film, the backside wiring line including a first surface and a second surface opposite each other in a first direction; a fin-type pattern on the first surface of the backside wiring line, the fin-type pattern extending in a second direction; a second backside interlayer insulating film between the fin-type pattern and the first backside interlayer insulating film, the fin-type type pattern and the second backside interlayer insulating film defining a backside contact hole, the backside contact hole including a first backside contact hole and a second backside contact hole in fluid communication with each other, the first backside contact hole being in the fin-type pattern on a bottom of the second backside contact hole, and the second backside contact hole being in the second backside interlayer insulating film; a gate electrode on the fin-type pattern and extending in a third direction; a first source/drain pattern on a first side of the gate electrode and on the fin-type pattern; a backside source/drain contact in the backside contact hole on the first surface of the backside wiring line, the backside source/drain contact connecting the backside wiring line and the first source/drain pattern. The backside source/drain contact may include an upper pattern and a lower pattern. The upper pattern of the backside source/drain contact may be between the lower pattern of the backside source/drain contact and the first source/drain pattern. The upper pattern of the backside source/drain contact may fill at least a portion of the first backside contact hole, and the upper pattern of the backside source/drain contact may have a single conductive film structure.

According to an embodiment of the present disclosure, a semiconductor device may include a first backside interlayer insulating film; a backside wiring line in the first backside interlayer insulating film, the backside wiring line including a first surface and a second surface opposite each other in a first direction; a fin-type pattern on the first surface of the backside wiring line, the fin-type pattern extending in a second direction; a second backside interlayer insulating film between the fin-type pattern and the first backside interlayer insulating film; a gate electrode on the fin-type pattern and extending in a third direction; a source/drain pattern on a first side surface of the gate electrode and on the fin-type pattern; a backside source/drain contact in the second backside interlayer insulating film and the fin-type pattern, the backside source/drain contact connecting the backside wiring line and the source/drain pattern; and a contact silicide film between the backside source/drain contact and the source/drain pattern. The backside source/drain contact may include an upper pattern and a lower pattern. The upper pattern may be in contact with the fin-type pattern and the contact silicide film. The lower pattern may be in contact with the second backside interlayer insulating film. The upper pattern of the backside source/drain contact may have a single conductive film structure made of metal. An interface between the upper pattern of the backside source/drain contact and the lower pattern of the backside source/drain contact may face the backside wiring line and may have either a convex shape or an inclined shape facing the backside wiring line.

According to an embodiment of the present disclosure, a semiconductor device may include a first backside interlayer insulating film; a backside wiring line in the first backside interlayer insulating film, the backside wiring line including a first surface and a second surface opposite each other in a first direction; a fin-type pattern on the first surface of the backside wiring line, the fin-type pattern extending in a second direction; a second backside interlayer insulating film between the fin-type pattern and the first backside interlayer insulating film, the fin-type type pattern and the second backside interlayer insulating film defining a backside contact hole, the backside contact hole including a first backside contact hole and a second backside contact hole in fluid communication with each other, the first backside contact hole being in the fin-type pattern on a bottom of the second backside contact hole, and the second backside contact hole being in the second backside interlayer insulating film; a plurality of sheet patterns on the fin-type pattern and spaced apart from the fin-type pattern in the first direction; a gate electrode on the fin-type pattern, the gate electrode extending in a third direction and surrounding the plurality of sheet patterns; a source/drain pattern on a side surface of the gate electrode and on the fin-type pattern; a backside source/drain contact on the first surface of the backside wiring line, the backside source/drain contact connecting the backside wiring line and the source/drain pattern; and a contact silicide film between the backside source/drain contact and the source/drain pattern. The backside source/drain contact may include an upper pattern and a lower pattern. The upper pattern of the backside source/drain contact may be in contact with the fin-type pattern and the contact silicide film. The lower pattern of the backside source/drain contact may be in contact with the second backside interlayer insulating film. The upper pattern of the backside source/drain contact may have a single conductive film structure made of metal. The lower pattern of the backside source/drain contact may include a backside contact liner and a backside contact plug. The backside contact liner and the backside contact plug may include a metal. The backside contact liner may be in contact with the upper pattern of the backside source/drain contact and the second backside interlayer insulating film. The backside contact line may define a backside liner recess, and the backside contact plug may fill the backside liner recess.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
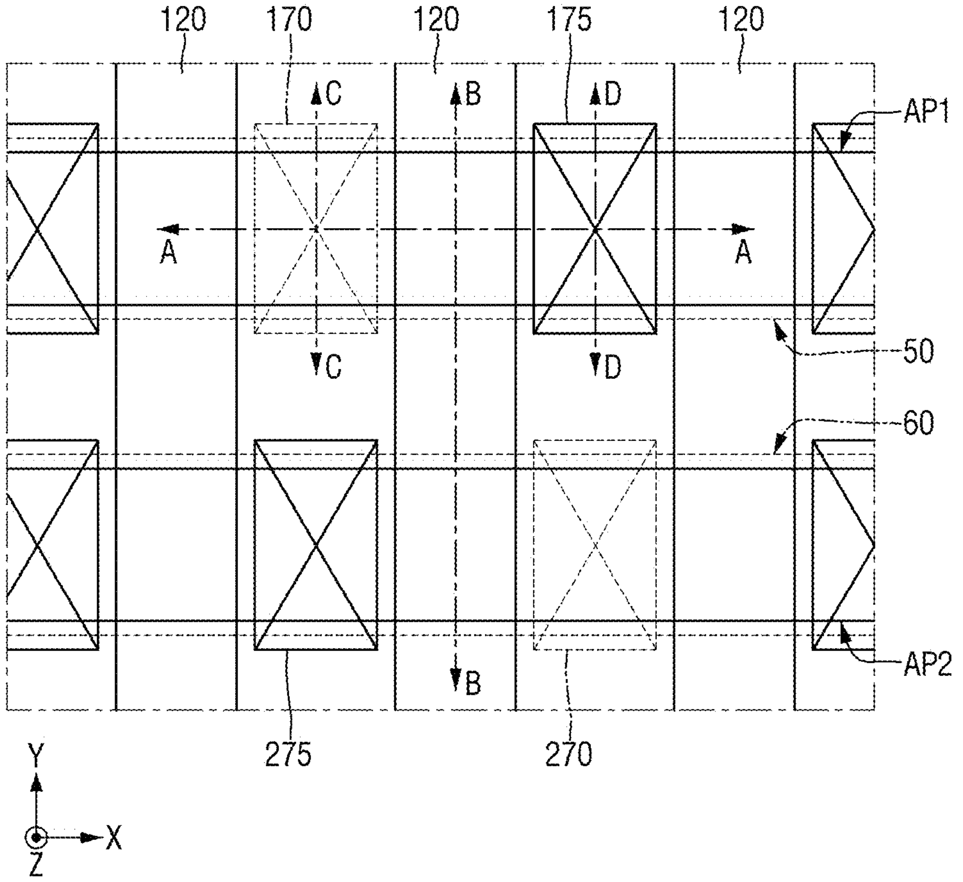
FIG. 1 is an example layout view for describing a semiconductor device according to some example embodiments.

Terms "first", "second", and the like are used herein to describe various elements or components, but these elements or components are not limited by these terms. These terms are used only to distinguish one element or component from another element or component. Therefore, a first element or component mentioned below may be a second element or component within the technical spirit of the present disclosure.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

In the drawings of a semiconductor device according to some example embodiments, a fin-type transistor (FinFET) including a channel region having a fin-type pattern shape, a transistor including nanowires or nanosheets, and a multi-bridge channel field effect transistor (MBCFET™) are illustrated as examples, but the present disclosure is not limited thereto.

The semiconductor device according to some example embodiments may include a tunneling FET, a three-dimensional (3D) transistor, or a vertical FET. The semiconductor device according to some example embodiments may include a planar transistor. In addition, technical ideas of the present disclosure may be applied to two-dimensional (2D) material based FETs and a heterostructure thereof.

In addition, the semiconductor device according to some example embodiments may also include a bipolar junction transistor, a lateral double-diffused metal oxide semiconductor (LDMOS) transistor, or the like.

The semiconductor device according to some example embodiments will be described with reference to FIGS. 1 to 6.

Figure 2:
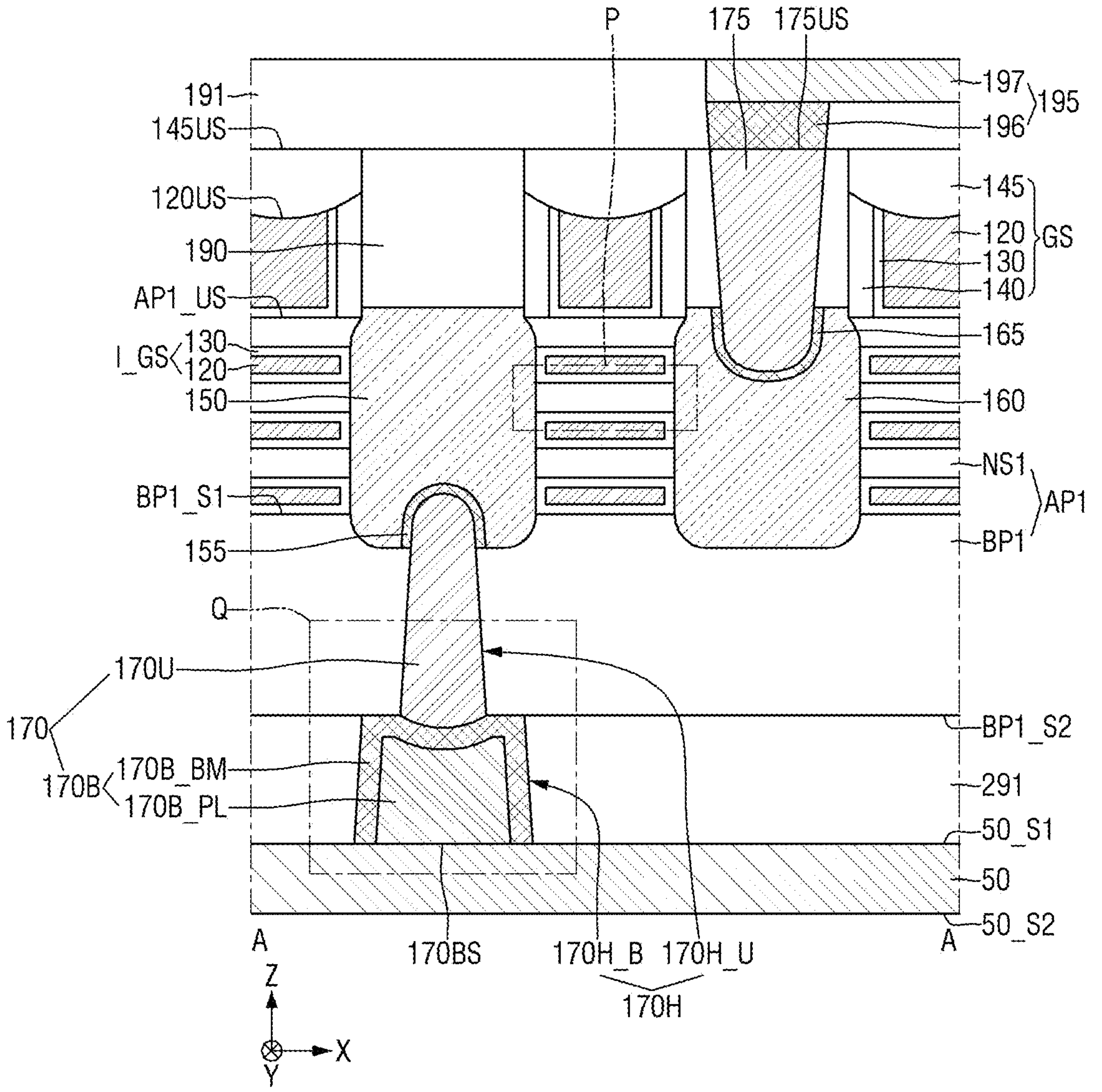
FIG. 2 is a cross-sectional view taken along line A-A of FIG. 1.
Figure 3:
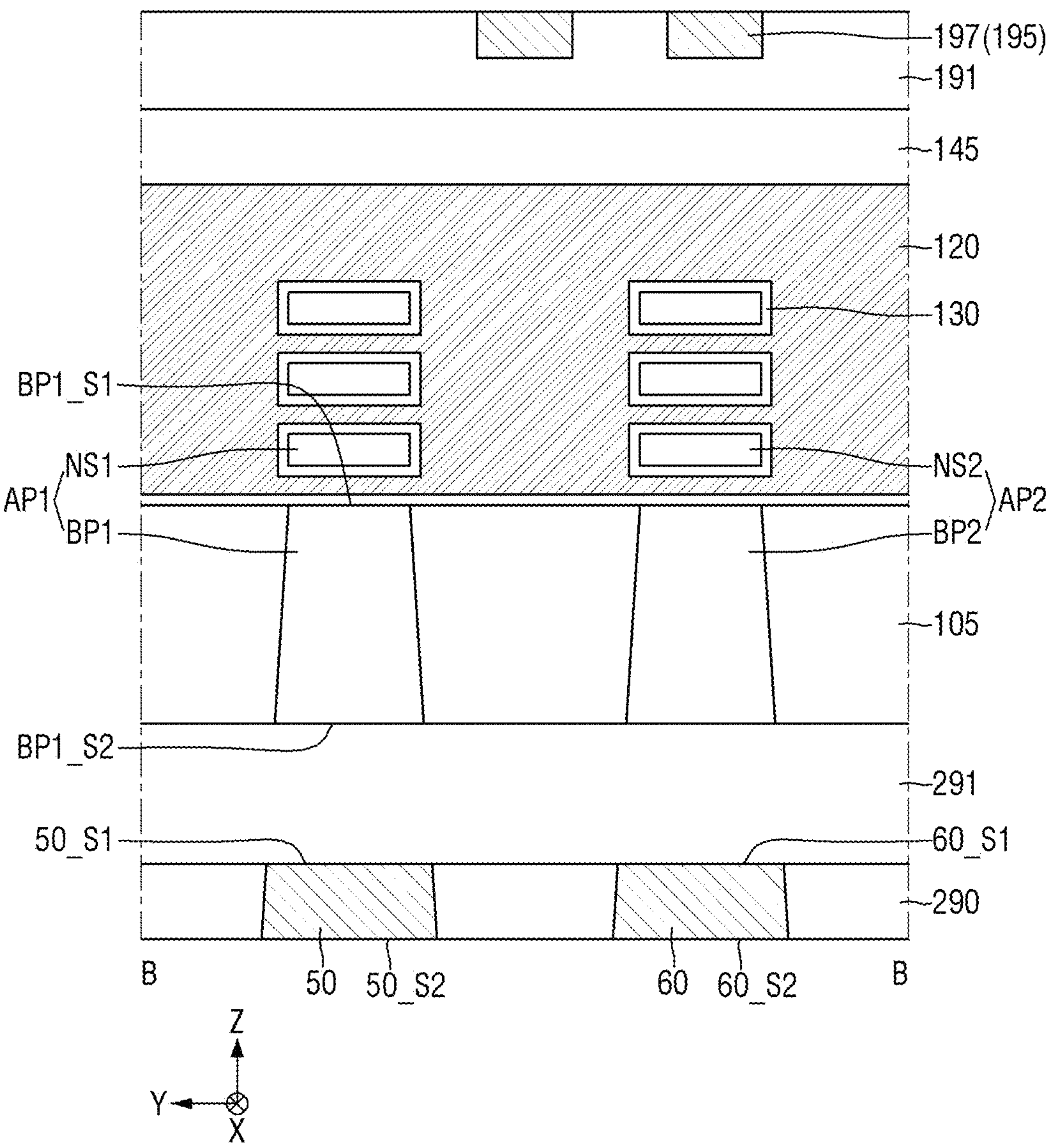
FIG. 3 is a cross-sectional view taken along line B-B of FIG. 1.
Figure 4:
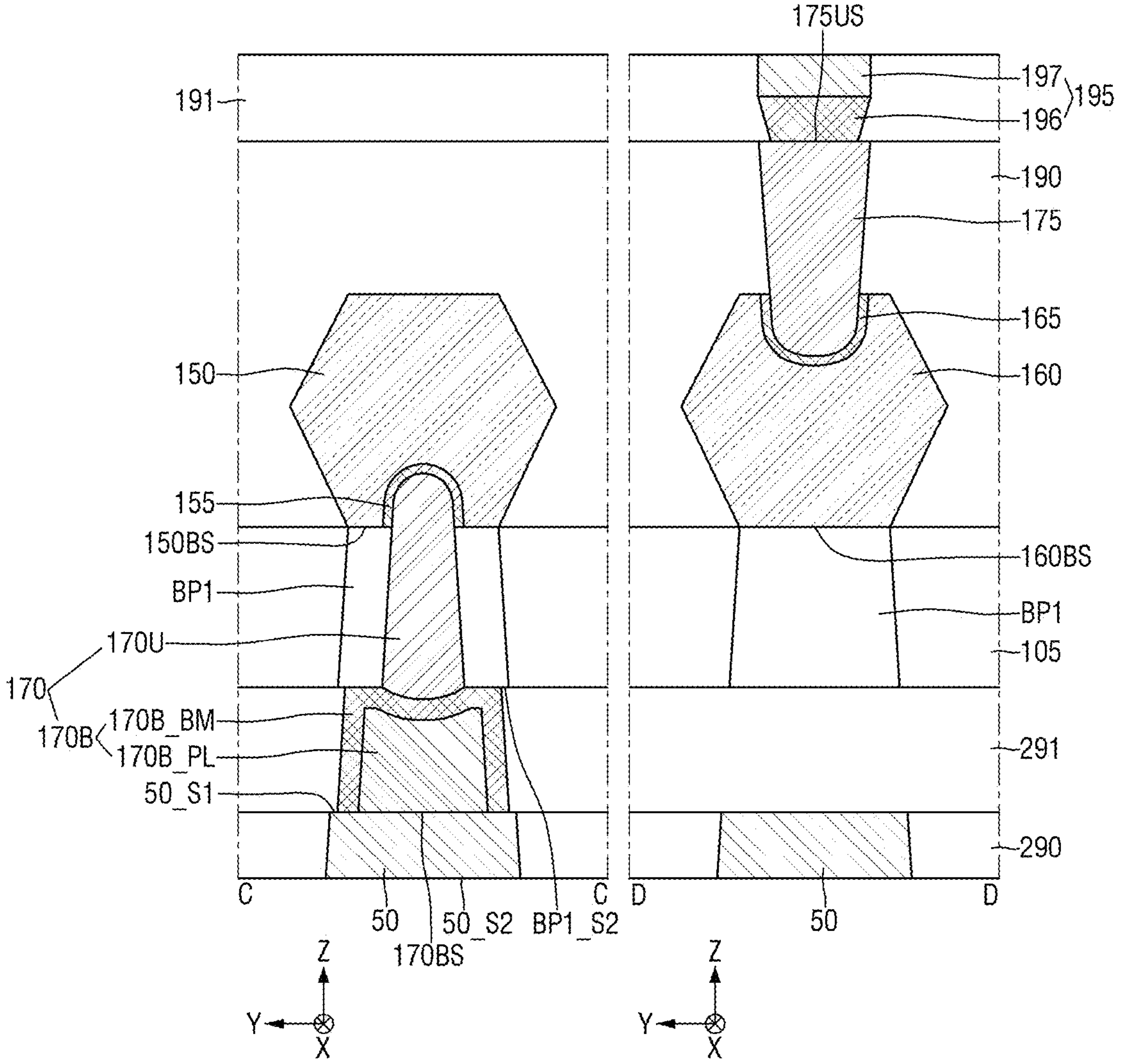
FIG. 4 is a cross-sectional view taken along lines C-C and D-D of FIG. 1.
Figure 5:
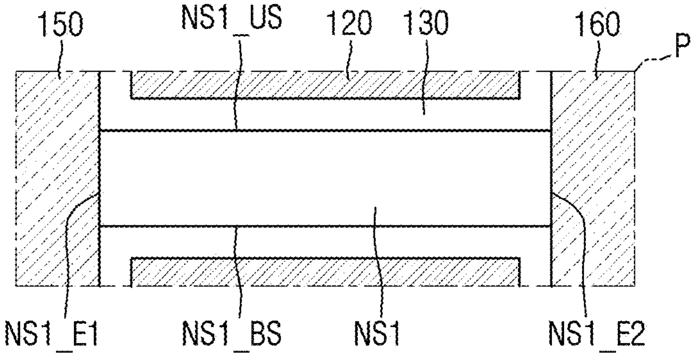
FIG. 5 is an enlarged view of part P of FIG. 2.
Figure 6:
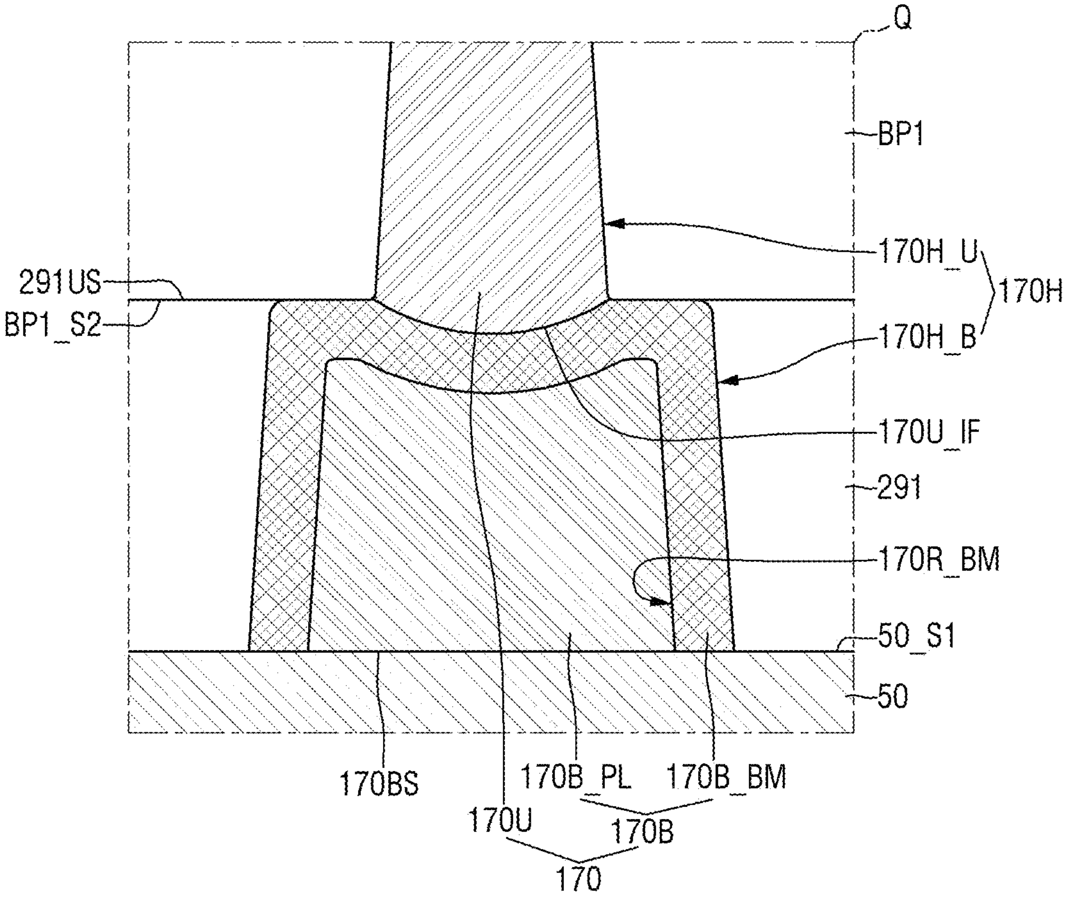
FIG. 6 is an enlarged view of part Q of FIG. 2.

FIG. 1 is an example layout view for describing a semiconductor device according to some example embodiments. FIG. 2 is a cross-sectional view taken along line A-A of FIG. 1. FIG. 3 is a cross-sectional view taken along line B-B of FIG. 1. FIG. 4 is a cross-sectional view taken along lines C-C and D-D of FIG. 1. FIG. 5 is an enlarged view of part P of FIG. 2. FIG. 6 is an enlarged view of part Q of FIG. 2. For convenience of explanation, a frontside wiring structure 195 is not illustrated in FIG. 1.

Although not illustrated, a cross-sectional view taken along a second active pattern AP2 in a first direction X may be similar to FIG. 2.

Referring to FIGS. 1 to 6, a semiconductor device according to some example embodiments may include a first active pattern AP1, a second active pattern AP2, a plurality of gate electrodes 120, a first source/drain pattern 150, a second source/drain pattern 160, a first backside source/drain contact 170, a second backside source/drain contact 270, a first frontside source/drain contact 175, a second frontside source/drain contact 275, a first backside wiring line 50, a second backside wiring line 60, and a frontside wiring structure 195.

The first backside wiring line 50 and the second backside wiring line 60 may be disposed in a first backside interlayer insulating film 290. Each of the first backside wiring line 50 and the second backside wiring line 60 may extend in the first direction X. The first backside wiring line 50 may be spaced apart from the second backside wiring line 60 in a second direction Y.

As an example, the first backside wiring line 50 and the second backside wiring line 60 may be power lines that supply power to the semiconductor device. As another example, the first backside wiring line 50 and the second backside wiring line 60 may be signal lines that supply operation signals of the semiconductor device. As still another example, one of the first backside wiring line 50 and the second backside wiring line 60 may be a power line, and the other thereof may be a signal line.

The first backside wiring line 50 may include a first surface 50_S1 and a second surface 50_S2 that are opposite in a third direction Z. The second backside wiring line 60 may include a first surface 60_S1 and a second surface 60_S2 that are opposite in the third direction Z. Here, the first direction X may intersect the second direction Y and a third direction Z. In addition, the second direction Y may intersect the third direction Z.

The first backside wiring line 50 and the second backside wiring line 60 are illustrated as having a trapezoidal cross-section, but are not limited thereto. Although not illustrated, the first backside wiring line 50 and the second backside wiring line 60 may have a rectangular cross-section. The first backside wiring line 50 will be described as an example. A width of the first surface 50_S1 of the first backside wiring line in the second direction Y may be smaller than a width of the second surface 50_S2 of the first backside wiring line in the second direction Y.

For example, the first backside wiring line 50 and the second backside wiring line 60 may be formed using a damascene process. After a trench extending in the first direction X is formed in the first backside interlayer insulating film 290, the first backside wiring line 50 may be formed by filling the trench with a conductive material.

The first backside wiring line 50 and the second backside wiring line 60 are illustrated as having a single conductive film structure, but are not limited thereto. Although not illustrated, the first backside wiring line 50 and the second backside wiring line 60 may have a multi-conductive film structure including a contact liner and a contact plug such as a lower pattern 170B of the first backside source/drain contact illustrated in FIGS. 2 and 4.

The first backside wiring line 50 and the second backside wiring line 60 may include, for example, at least one of a metal, conductive metal nitride, conductive metal carbide, conductive metal oxide, conductive metal carbonitride, and a two-dimensional (2D) material. The 2D material may include a two-dimensional allotrope or a two-dimensional compound, and may include, for example, at least one of, for example, graphene, boron nitride (BN), molybdenum sulfide, molybdenum selenide, tungsten sulfide, tungsten selenide, and tantalum sulfide, but is not limited thereto. That is, since the above-described 2D material is only listed as an example, the 2D material that may be included in the semiconductor device of the present disclosure is not limited by the above-described material.

Although not illustrated, each of the first backside wiring line 50 and the second backside wiring line 60 may extend in the second direction Y. In this case, the shapes of the cross-sectional views taken along lines A-A, B-B, C-C, and D-D of FIG. 1 may vary.

A second backside interlayer insulating film 291 may be disposed on the first backside interlayer insulating film 290. The second backside interlayer insulating film 291 may be disposed on the first surface 50_S1 of the first backside wiring line 50 and the first surface 60_S1 of the second backside wiring line 60.

The second backside interlayer insulating film 291 may include an upper surface 291US. The second backside interlayer insulating film 291 may include a lower surface that is opposite to the upper surface 291US of the second backside interlayer insulating film in the third direction Z. The lower surface of the second backside interlayer insulating film 291 faces the first backside wiring line 50 and the second backside wiring line 60.

Each of the first backside interlayer insulating film 290 and the second backside interlayer insulating film 291 may include, for example, at least one of silicon oxide, silicon nitride, silicon carbonitride, silicon oxynitride, and a low-k material. A dielectric constant of the low-k material may have a value smaller than 3.9, which is a dielectric constant of silicon oxide.

The first active pattern AP1 and the second active pattern AP2 may each be disposed on the second backside interlayer insulating film 291. The second backside interlayer insulating film 291 may be disposed between the first backside interlayer insulating film 290 and the first active pattern AP1 and between the first backside interlayer insulating film 290 and the second active pattern AP2.

Each of the first active pattern AP1 and the second active pattern AP2 may extend in the first direction X to be long. For example, the first active pattern AP1 and the second active pattern AP2 may be disposed on the first backside wiring line 50 and the second backside wiring line 60, respectively. The first active pattern AP1 and the second active pattern AP2 may be disposed on the first surface 50_S1 of the first backside wiring line and the first surface 60_S1 of the second backside wiring line, respectively. The first surface 50_S1 of the first backside wiring line and the first surface 60_S1 of the second backside wiring line may face the first active pattern AP1 and the second active pattern AP2. The first active pattern AP1 and the second active pattern AP2 may be disposed on the upper surface 291US of the second backside interlayer insulating film.

The first active pattern AP1 and the second active pattern AP2 may be spaced apart from each other in the second direction Y. The first active pattern AP1 and the second active pattern AP2 may be adjacent to each other in the second direction Y.

The first active pattern AP1 is illustrated as being closest to the second active pattern AP2 in the second direction Y, but is not limited thereto. An additional active pattern may also be disposed between the first active pattern AP1 and the second active pattern AP2.

As an example, the first active pattern AP1 may be an area in which a p-type transistor is formed, and the second active pattern AP2 may be an area in which an n-type transistor is formed. As another example, the first active pattern AP1 and the second active pattern AP2 may be areas in which a p-type transistor is formed. As still another example, the first active pattern AP1 and the second active pattern AP2 may be areas in which an n-type transistor is formed. Hereinafter, the first active pattern AP1 and the second active pattern AP2 will be described as areas in which transistors of different conductivity types are formed.

Each of the first active pattern AP1 and the second active pattern AP2 may be a multi-channel active pattern. For example, the first active pattern AP1 may include a first lower pattern BP1 and a plurality of first sheet patterns NS1. The second active pattern AP2 may include a second lower pattern BP2 and a plurality of second sheet patterns NS2. In the semiconductor device according to some example embodiments, each of the first and second active patterns AP1 and AP2 may be an active pattern including nanosheets or nanowires.

The first lower pattern BP1 and the second lower pattern BP2 may be disposed on the second backside interlayer insulating film 291. The second backside interlayer insulating film 291 may be disposed between the first backside interlayer insulating film 290 and the first lower pattern BP1 and between the first backside interlayer insulating film 290 and the second lower pattern BP2.

The first lower pattern BP1 and the second lower pattern BP2 may protrude in the third direction Z. The first lower pattern BP1 and the second lower pattern BP2 may each be a fin-type pattern.

Each of the first lower pattern BP1 and the second lower pattern BP2 may extend in the first direction X to be long. The first lower pattern BP1 may be spaced apart from the second lower pattern BP2 in the second direction Y. The first lower pattern BP1 and the second lower pattern BP2 may be separated by a fin trench extending in the first direction X.

The first lower pattern BP1 may include a first surface BP1_S1 and a second surface BP1_S2 that are opposite to each other in the third direction Z. The second surface BP1_S2 of the first lower pattern may face the second backside interlayer insulating film 291, the first backside wiring line 50, and the second backside wiring line 60. The first backside wiring line 50 and the second backside wiring line 60 may be disposed on the second surface BP1_S2 of the first lower pattern. The second surface BP1_S2 of the first lower pattern faces the upper surface 291US of the second backside interlayer insulating film. For example, the first lower pattern BP1 may be in contact with the upper surface 291US of the second backside interlayer insulating film.

For example, the second surface BP1_S2 of the first lower pattern may be a lower surface of the first lower pattern BP1. The first surface BP1_S1 of the first lower pattern may be an upper surface of the first lower pattern BP1.

Like the first lower pattern BP1, the second lower pattern BP2 may also include first and second surfaces that are opposite to each other in the third direction Z. The second surface of the second lower pattern BP2 may face the second backside interlayer insulating film 291, the first backside wiring line 50, and the second backside wiring line 60. For example, the second lower pattern BP2 may be in contact with the upper surface 291US of the second backside interlayer insulating film.

The first lower pattern BP1 may include a sidewall connecting the first surface BP1_S1 of the first lower pattern and the second surface BP1_S2 of the first lower pattern. The sidewall of the first lower pattern BP1 may extend in the first direction X. The second lower pattern BP2 may include a sidewall extending in the first direction X. The sidewall of the second lower pattern BP2 faces the sidewall of the first lower pattern BP1.

The plurality of first sheet patterns NS1 may be disposed on the first lower pattern BP1. The plurality of first sheet patterns NS1 may be disposed on the first surface BP1_S1 of the first lower pattern. The plurality of first sheet patterns NS1 may be spaced apart from the first lower pattern BP1 in the third direction Z.

The plurality of second sheet patterns NS2 may be disposed on the second lower pattern BP2. The plurality of second sheet patterns NS2 may be disposed on the first surface of the second lower pattern BP2. The plurality of second sheet patterns NS2 may be spaced apart from the second lower pattern BP2 in the third direction Z.

The first sheet pattern NS1 and the second sheet pattern NS2 may be disposed on the first surface 50_S1 of the first backside wiring line and the first surface 60_S1 of the second backside wiring line.

Although it is illustrated that three first sheet patterns NS1 and three second sheet patterns NS2 are each disposed in the third direction Z, this is merely for convenience of explanation, and the present disclosure is not limited thereto.

In FIGS. 2 and 5, the first sheet pattern NS1 may include an upper surface NS1_US and a lower surface NS1_BS. The upper surface NS1_US of the first sheet pattern is opposite to the lower surface NS1_BS of the first sheet pattern in the third direction Z. The lower surface NS1_BS of the first sheet pattern may face the first backside wiring line 50 and the second backside wiring line 60.

The first sheet pattern NS1 may include a first end NS1_E1 and a second end NS1_E2. The first end NS1_E1 of the first sheet pattern is spaced apart from the second end NS1_E2 of the first sheet pattern in the first direction X. The first end NS1_E1 of the first sheet pattern and the second end NS1_E2 of the first sheet pattern may be portions connected to source/drain patterns 150 and 160 to be described later, respectively.

The first sheet pattern NS1 may include an uppermost sheet pattern furthest from the first backside wiring line 50 and the second backside wiring line 60. An upper surface AP1_US of the first active pattern may be an upper surface of the uppermost sheet pattern of the first sheet pattern NS1. Descriptions of the second active pattern AP2 and the second sheet pattern NS2 may be substantially the same as those of the first active pattern AP1 and the first sheet pattern NS1.

The first lower pattern BP1 and the second lower pattern BP2 may each include silicon or germanium, which is an elemental semiconductor material. In addition, the first lower pattern BP1 and the second lower pattern BP2 may each include a compound semiconductor, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Gc), and tin (Sn), or a compound obtained by doping carbon (C), silicon (Si), germanium (Ge), and tin (Sn) with a group IV element.

The III-V compound semiconductor may be, for example, one of a binary compound, a ternary compound, or a quaternary compound formed by combining at least one of aluminum (Al), gallium (Ga), and indium (In), which are group III elements, and one of phosphorus (P), arsenic (As), and antimony (Sb), which are group V elements.

Each of the first sheet pattern NS1 and the second sheet pattern NS2 may include one of silicon or germanium, which is an elemental semiconductor material, a group IV-IV compound semiconductor, or a group III-V compound semiconductor. A width of the first sheet pattern NS1 in the second direction Y may increase or decrease in proportion to a width of the first lower pattern BP1 in the second direction Y. A width of the second sheet pattern NS2 in the second direction Y may increase or decrease in proportion to a width of the second lower pattern BP2 in the second direction Y.

The first sheet pattern NS1 will be described as an example. Each of the first sheet patterns NS1 disposed on the first lower pattern BP1 is illustrated as having the same width in the second direction Y, but is not limited thereto.

A field insulating film 105 may be disposed on the first backside wiring line 50 and the second backside wiring line 60. For example, the field insulating film 105 may be disposed on the first surface 50_S1 of the first backside wiring line and the first surface 60_S1 of the second backside wiring line.

The field insulating film 105 may be disposed on the sidewall of the first lower pattern BP1 and the sidewall of the second lower pattern BP2. As an example, the field insulating film 105 may cover the entire sidewall of the first lower pattern BP1 and the entire sidewall of the second lower pattern BP2. Although not illustrated, as another example, the field insulating film 105 may cover a portion of the sidewall of the first lower pattern BP1 and/or a portion of the sidewall of the second lower pattern BP2.

The field insulating film 105 does not cover the first surface BP1_S1 of the first lower pattern and the first surface of the second lower pattern BP2. With respect to the first backside wiring line 50 and the second backside wiring line 60, the first sheet pattern NS1 and the second sheet pattern NS2 are disposed to be higher than an upper surface of the field insulating film 105. The field insulating film 105 may include upper and lower surfaces that are opposite in the third direction Z. The lower surface of the field insulating film 105 faces the first backside wiring line 50 and the second backside wiring line 60. The lower surface of the field insulating film 105 may be in contact with the second backside interlayer insulating film 291.

The field insulating film 105 may include, for example, an oxide film, a nitride film, an oxynitride film, or a combination thereof. Although it is illustrated that the field insulating film 105 is a single film, this is merely for convenience of explanation, and the present disclosure is not limited thereto.

A plurality of gate structures GS may be disposed on the upper surface of the field insulating film 105. Each gate structure GS may extend in the second direction Y. The gate structures GS may be disposed to be spaced apart from each other in the first direction X. The gate structures GS may be adjacent to each other in the first direction X.

The gate structure GS may be disposed on the first active pattern AP1 and the second active pattern AP2. The gate structure GS may intersect the first active pattern AP1 and the second active pattern AP2.

The gate structure GS may intersect the first lower pattern BP1 and the second lower pattern BP2. The gate structure GS may surround each first sheet pattern NS1. The gate structure GS may surround each second sheet pattern NS2.

Although it is illustrated that the gate structure GS is disposed across the first active region RX1 and the second active region RX2, it is merely for convenience of explanation, and the present disclosure is not limited thereto. That is, a portion of the gate structure GS may be separated into two portions by a gate separation structure (GCS in FIGS. 24 and 25) disposed on the field insulating film 105 and disposed on the first active pattern AP1 and the second active pattern AP2.

The gate structure GS may include, for example, a gate electrode 120, a gate insulating film 130, a gate spacer 140, and a gate capping pattern 145.

The gate structure GS may include a plurality of inner gate structures I_GS disposed between the first sheet patterns NS1 adjacent in the third direction Z and between the first lower pattern BP1 and the first sheet pattern NS1. The inner gate structure I_GS may be disposed between the first surface BP1_S1 of the first lower pattern and the lower surface NS1_BS of the first sheet pattern and between the upper surface NS1_US of the first sheet pattern and the lower surface NS1_BS of the first sheet pattern facing in the third direction Z. The inner gate structure I_GS may include a gate electrode 120 and a gate insulating film 130.

The number of inner gate structures I_GS may be the same as the number of first sheet patterns NS1. The inner gate structure I_GS is in contact with the first surface BP1_S1 of the first lower pattern, the upper surface NS1_US of the first sheet pattern, and the lower surface NS1_BS of the first sheet pattern. In the semiconductor device according to some example embodiments, the inner gate structure I_GS may be in contact with source/drain patterns 150 and 160 to be described later.

The inner gate structure I_GS includes a gate electrode 120 and a gate insulating film 130 disposed between the first sheet patterns NS1 adjacent to each other and between the first lower pattern BP1 and the first sheet pattern NS1.

Although not illustrated, the inner gate structure I_GS may be disposed between the second sheet patterns NS2 adjacent to each other in the third direction Z and between the second lower pattern BP2 and the second sheet pattern NS2.

The gate electrode 120 may be disposed on the first lower pattern BP1 and the second lower pattern BP2. The gate electrode 120 may intersect the first lower pattern BP1 and the second lower pattern BP2. The gate electrode 120 may surround the first sheet pattern NS1 and the second sheet pattern NS2.

In the cross-sectional view of FIG. 2, an upper surface 120US of the gate electrode is illustrated as being a concave curved surface, but is not limited thereto. The upper surface 120US of the gate electrode may also be a planar surface.

The gate electrode 120 may include at least one of a metal, conductive metal nitride, metal silicide, a doped semiconductor material, conductive metal oxide, and conductive metal oxynitride. The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAIN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but is not limited thereto. The conductive metal oxide and the conductive metal oxynitride may include an oxidized form of the above-described materials, but are not limited thereto.

The gate insulating film 130 may extend along the upper surface of the field insulating film 105, the first surface BP1_S1 of the first lower pattern, and the first surface of the second lower pattern BP2. The gate insulating film 130 may surround the plurality of first sheet patterns NS1. The gate insulating film 130 may surround the plurality of second sheet patterns NS2. The gate insulating film 130 may be disposed along a circumference of the first sheet pattern NS1 and a circumference of the second sheet pattern NS2. The gate electrode 120 is disposed on the gate insulating film 130.

The gate insulating film 130 is disposed between the gate electrode 120 and the first sheet pattern NS1 and between the gate electrode 120 and the second sheet pattern NS2. In the semiconductor device according to some example embodiments, the gate insulating film 130 included in the inner gate structure I_GS may be in contact with source/drain patterns 150 and 160 to be described later.

The gate insulating film 130 may include silicon oxide, silicon oxynitride, silicon nitride, or a high-k material having a dielectric constant greater than that of silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although it is illustrated that the gate insulating film 130 is a single film, this is merely for convenience of explanation, and the present disclosure is not limited thereto. The gate insulating film 130 may include a plurality of films. The gate insulating film 130 may also include an interfacial layer and a high-k insulating film disposed between the first active pattern AP1 and the gate electrode 120 and between the second active pattern AP2 and the gate electrode 120. For example, the interface layer may not be formed along a profile of the upper surface of the field insulating film 105.

The semiconductor device according to some example embodiments may include a negative capacitance (NC) FET using a negative capacitor. For example, the gate insulating film 130 may include a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected in series with each other and the capacitance of each capacitor has a positive value, a total capacitance decreases as compared with a capacitance of each individual capacitor. On the other hand, when at least one of the capacitances of two or more capacitors connected in series with each other has a negative value, the total capacitance may be greater than an absolute value of each individual capacitance while having a positive value.

When the ferroelectric material film having the negative capacitance and the paraelectric material film having the positive capacitance are connected in series with each other, a total capacitance value of the ferroelectric material film and the paraelectric material film connected in series with each other may increase. A transistor including the ferroelectric material film may have a subthreshold swing (SS) less than 60 mV/decade at room temperature by using the increase in the total capacitance value.

The ferroelectric material film may have the ferroelectric characteristics. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may also be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may vary depending on a type of ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, a ratio of the dopant may be a ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may contain 1 to 7 at % of gadolinium. When the dopant is zirconium (Zr), the ferroelectric material film may include 50 to 80 at % of zirconium.

The paraelectric material film may have the paraelectric characteristics. The paraelectric material film may include, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include the same material. The ferroelectric material film may have the ferroelectric characteristics, but the paraelectric material film may not have the ferroelectric characteristics. For example, when the ferroelectric material film and the paraelectric material film include the hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may vary for each ferroelectric material, the thickness of the ferroelectric material film may vary depending on the ferroelectric material.

As an example, the gate insulating film 130 may include one ferroelectric material film. As another example, the gate insulating film 130 may include a plurality of ferroelectric material films spaced apart from each other. The gate insulating film 130 may have a stacked film structure in which a plurality of ferroelectric material films and a plurality of paraelectric material films are alternately stacked.

The gate spacer 140 may be disposed on a sidewall of the gate electrode 120. The gate spacer 140 may not be disposed between the first lower pattern BP1 and the first sheet pattern NS1 and between the first sheet patterns NS1 adjacent to each other in the third direction Z.

The gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. Although it is illustrated that the gate spacer 140 is a single film, this is merely for convenience of explanation, and the present disclosure is not limited thereto.

The gate capping pattern 145 may be disposed on the gate electrode 120. An upper surface 145US of the gate capping pattern may be on the same plane as an upper surface of a first interlayer insulating film 190. Although not illustrated, the gate capping pattern 145 may be disposed between the gate spacers 140.

The gate capping pattern 145 may include, for example, at least one of silicon nitride (SiN), silicon oxynitride (SiON), silicon carbonitride (SiCN), silicon oxycarbonitride (SiOCN), and a combination thereof. The gate capping pattern 145 may include a material having an etching selectivity with respect to the first interlayer insulating film 190.

The first source/drain pattern 150 may be disposed on the first active pattern AP1. The first source/drain pattern 150 may be disposed on the first lower pattern BP1.

The first source/drain pattern 150 may be disposed between the gate electrodes 120 adjacent to each other in the first direction X. The first source/drain pattern 150 may be disposed on a side surface of the gate electrode 120. The first source/drain pattern 150 may be in contact with the first active pattern AP1. The first source/drain pattern 150 may be in contact with the first sheet pattern NS1. The first source/drain pattern 150 may be disposed on the first surface 50_S1 of the first backside wiring line and the first surface 60_S1 of the second backside wiring line. The first source/drain pattern 150 may be connected to the first end NS1_E1 of the first sheet pattern NS1.

The second source/drain pattern 160 may be disposed on the first active pattern AP1. The second source/drain pattern 160 may be disposed on the first lower pattern BP1.

The second source/drain pattern 160 may be disposed between the gate electrodes 120 adjacent to each other in the first direction X. The second source/drain pattern 160 may be disposed on a side surface of the gate electrode 120.

The gate electrode 120 may be disposed between the first source/drain pattern 150 and the second source/drain pattern 160. The first source/drain pattern 150 may be disposed on one side of the gate electrode 120, and the second source/drain pattern 160 may be disposed on the other side of the gate electrode 120.

The second source/drain pattern 160 may be in contact with the first active pattern AP1. The second source/drain pattern 160 may be in contact with the first sheet pattern NS1. The second source/drain pattern 160 may be disposed on the first surface 50_S1 of the first backside wiring line and the first surface 60_S1 of the second backside wiring line. The second source/drain pattern 160 may be connected to the second end NS1_E2 of the first sheet pattern NS1.

The first source/drain pattern 150 and the second source/drain pattern 160 may be in contact with the first lower pattern BP1. A bottom surface 150BS of the first source/drain pattern and a bottom surface 160BS of the second source/drain pattern may be in contact with the first lower pattern BP1.

Although not illustrated, the source/drain pattern may be disposed on the second lower pattern BP2 between the gate electrodes 120. The source/drain pattern on the second lower pattern BP2 may be connected to the end of the second sheet pattern NS2.

The first source/drain pattern 150 and the second source/drain pattern 160 may be included in a source/drain of a transistor that uses the first sheet pattern NS1 as a channel region.

The first source/drain pattern 150 and the second source/drain pattern 160 may each include an epitaxial pattern. The first source/drain pattern 150 and the second source/drain pattern 160 may each include a semiconductor material.

The first source/drain pattern 150 and the second source/drain pattern 160 may include, for example, silicon or germanium, which is an elemental semiconductor material. In addition, the first source/drain pattern 150 and the second source/drain pattern 160 may include, for example, a binary compound or a ternary compound including at least two or more of carbon (C), silicon (Si), germanium (Ge), and tin (Sn), or a compound obtained by doping carbon (C), silicon (Si), germanium (Ge), and tin (Sn) with a group IV element. The first source/drain pattern 150 and the second source/drain pattern 160 may each include an epitaxial film made of a semiconductor. Although it the first source/drain pattern 150 and the second source/drain pattern 160 each are shown as a single film, this is merely for convenience of explanation, and the present disclosure is not limited thereto.

The first source/drain pattern 150 and the second source/drain pattern 160 may include dopants doped into a semiconductor material. The first source/drain pattern 150 and the second source/drain pattern 160 may include dopants of the same conductivity type.

As an example, the first source/drain pattern 150 and the second source/drain pattern 160 include, for example, a p-type dopant. The p-type dopant may include at least one of boron (B) and gallium (Ga), but is not limited thereto.

As another example, the first source/drain pattern 150 and the second source/drain pattern 160 include, for example, an n-type dopant. The n-type dopant may include at least one of phosphorus (P), arsenic (As), antimony (Sb), and bismuth (Bi), but is not limited thereto.

Although it is illustrated in FIG. 4 that an outer shape of the first source/drain pattern 150 and an outer shape of the second source/drain pattern 160 are similar to a hexagon, the present disclosure is not limited thereto. Although not illustrated, the outer shape of the first source/drain pattern 150 and the second source/drain pattern 160 may be similar to a pentagon or quadrangle.

The first frontside interlayer insulating film 190 is disposed on the first lower pattern BP1, the second lower pattern BP2, and the field insulating film 105. The first frontside interlayer insulating film 190 may be disposed on the first source/drain pattern 150 and the second source/drain pattern 160. The first frontside interlayer insulating film 190 may not cover the upper surface of the gate capping pattern 145. For example, an upper surface of the first frontside interlayer insulating film 190 may be on the same plane as the upper surface 145US of the gate capping pattern.

The first frontside interlayer insulating film 190 may be disposed on the first surface 50_S1 of the first backside wiring line and the first surface 60_S1 of the second backside wiring line. The first frontside interlayer insulating film 190 is disposed on the upper surface 291US of the second backside interlayer insulating film.

The first frontside interlayer insulating film 190 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bisbenzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

Although not illustrated, a source/drain etch stop film may extend along a profile of the first source/drain pattern 150 and a profile of the second source/drain pattern 160. The source/drain etch stop film may be disposed between the first source/drain pattern 150 and the first frontside interlayer insulating film 190, and between the second source/drain pattern 160 and the first frontside interlayer insulating film 190. The source/drain etch stop film may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), and a combination thereof.

The first backside source/drain contact 170 may extend to be long in the third direction Z. The first backside source/drain contact 170 may be connected to the first source/drain pattern 150. For example, the first backside source/drain contact 170 may be electrically connected to the first source/drain pattern 150.

The first backside source/drain contact 170 may be disposed between the first source/drain pattern 150 and the first backside wiring line 50. The first backside source/drain contact 170 connects the first source/drain pattern 150 and the first backside wiring line 50.

The first backside source/drain contact 170 may be connected to the first backside wiring line 50. The first backside source/drain contact 170 may be connected to the first surface 50_S1 of the first backside wiring line.

The first backside source/drain contact 170 may be disposed within the second backside interlayer insulating film 291 and the first lower pattern BP1. For example, the first backside source/drain contact 170 may penetrate through the second backside interlayer insulating film 291 and the first lower pattern BP1. The first backside source/drain contact 170 extends from the lower surface of the second backside interlayer insulating film 291 to the first source/drain pattern 150.

For example, a depth from the upper surface AP1_US of the first active pattern to a lower surface 170BS of the first backside source/drain contact may be the same as a depth from the upper surface AP1_US of the first active pattern to the lower surface of the second backside interlayer insulating film 291.

The first backside source/drain contact 170 may be disposed within a backside contact hole 170H. The first backside source/drain contact 170 may fill the backside contact hole 170H.

The backside contact hole 170H may include a first backside contact hole 170H_U and a second backside contact hole 170H_B. The first backside contact hole 170H_U may be formed on a bottom surface of the second backside contact hole 170H_B. The first backside contact hole 170H_U may extend from the bottom of the second backside contact hole 170H_B toward the first source/drain pattern 150.

The backside contact hole 170H may be disposed within the second backside interlayer insulating film 291 and the first lower pattern BP1. Since the backside contact hole 170H extends into the first source/drain pattern 150, a portion of the backside contact hole 170H may be disposed within the first source/drain pattern 150.

The first backside contact hole 170H_U may be disposed within the first lower pattern BP1 and the first source/drain pattern 150. The second backside contact hole 170H_B may be disposed within the second backside interlayer insulating film 291. The bottom surface of the second backside contact hole 170H_B may be defined by the second surface BP1_S2 of the first lower pattern. In other words, the first backside contact hole 170H_U may not be disposed within the second backside interlayer insulating film 291. The second backside contact hole 170H_B may not be disposed within the first lower pattern BP1.

The first backside source/drain contact 170 may be disposed within the backside contact hole 170H. The first backside source/drain contact 170 may fill the backside contact hole 170H.

The first backside source/drain contact 170 may include a lower pattern 170B and an upper pattern 170U. The upper pattern 170U of the first backside source/drain contact may be disposed between the lower pattern 170B of the first backside source/drain contact and the first source/drain pattern 150. The lower pattern 170B of the first backside source/drain contact may include the lower surface 170BS of the first backside source/drain contact.

The upper pattern 170U of the first backside source/drain contact may fill at least a portion of the first backside contact hole 170H_U. The lower pattern 170B of the first backside source/drain contact may fill at least a portion of the second backside contact hole 170H_B. For example, the upper pattern 170U of the first backside source/drain contact may fill an entirety of the first backside contact hole 170H_U. The upper pattern 170U of the first backside source/drain contact may not include a portion extending along the bottom surface of the second backside contact hole 170H_B.

The upper pattern 170U of the first backside source/drain contact may include an interface 170U_IF facing the first backside wiring line 50. The interface 170U_IF of the upper pattern of the first backside source/drain contact may face the first backside wiring line 50. For example, the lower pattern 170B of the first backside source/drain contact may be in contact with an entirety of the interface 170U_IF of the upper pattern of the first backside source/drain contact.

The interface 170U_IF of the upper pattern of the first backside source/drain contact may have a convex shape. For example, from a cross-sectional view, the interface 170U_IF of the upper pattern of the first backside source/drain contact may be a convex curved surface.

The first source/drain pattern 150 may be connected to the upper pattern 170U of the first backside source/drain contact 170. The first backside wiring line 50 may be connected to the lower pattern 170B of the first backside source/drain contact 170.

For example, the first backside source/drain contact 170 may be in contact with the first lower pattern BP1 and the second backside interlayer insulating film 291. The upper pattern 170U of the first backside source/drain contact may be in contact with the first lower pattern BP1. The lower pattern 170B of the first backside source/drain contact may be in contact with the second backside interlayer insulating film 291. Although not illustrated, a contact insulating liner including an insulating material may be disposed between the upper pattern 170U of the first backside source/drain contact and the first lower pattern BP1.

Although not illustrated, in FIG. 4, when the width of the first backside contact hole 170H_U in the second direction Y increases, at least a portion of the sidewall of the first backside contact hole 170H_U may be defined by the field insulating film 105. In this case, the upper pattern 170U of the first backside source/drain contact may be in contact with the field insulating film 105.

The upper pattern 170U of the first backside source/drain contact may have a single conductive film structure. The upper pattern 170U of the first backside source/drain contact may not have a multi-conductive film structure including different conductive materials. The upper pattern 170U of the first backside source/drain contact may be formed of a single conductive material. In this case, the upper pattern 170U of the first backside source/drain contact may include impurities unintentionally introduced during a process of forming the upper pattern 170U of the first backside source/drain contact.

As an example, the upper pattern 170U of the first backside source/drain contact may be formed of a single grain. As another example, the upper pattern 170U of the first backside source/drain contact may include a plurality of grains separated by grain boundaries. The upper pattern 170U of the first backside source/drain contact may include metal, for example, one of tungsten (W), molybdenum (Mo), ruthenium (Ru), cobalt (Co), iridium (Ir), and copper (Cu), but is not limited thereto. For example, the upper pattern 170U of the first backside source/drain contact may include a metal capable of being selectively grown on a conductive material.

The lower pattern 170B of the first backside source/drain contact may have a multi-conductive film structure. The lower pattern 170B of the first backside source/drain contact may include a backside contact liner 170B_BM and a backside contact plug 170B_PL. The backside contact liner 170B_BM may extend along the sidewall of the second backside contact hole 170H_B, the bottom surface of the second backside contact hole 170H_B, and the interface 170U_IF of the upper pattern of the first backside source/drain contact. For example, the backside contact liner 170B_BM may be in contact with the upper pattern 170U of the first backside source/drain contact and the second backside interlayer insulating film 291.

The backside contact liner 170B_BM may define a backside liner recess 170R_BM. The backside contact plug 170B_PL may be disposed on the backside contact liner 170B_BM. The backside contact plug 170B_PL may fill the backside liner recess 170R_BM.

The backside contact liner 170B_BM and the backside contact plug 170B_PL may each include a metal. The backside contact liner 170B_BM and the backside contact plug 170B_PL may each include, for example, one of tungsten (W), molybdenum (Mo), ruthenium (Ru), cobalt (Co), iridium (Ir), and copper (Cu), but is not limited thereto.

The backside contact liner 170B_BM includes a different metal from the upper pattern 170U of the first backside source/drain contact. As an example, the backside contact plug 170B_PL may include the same metal as the upper pattern 170U of the first backside source/drain contact. As another example, the backside contact plug 170B_PL may include a different metal from the upper pattern 170U of the first backside source/drain contact.

A shape in which the second backside source/drain contact 270 is electrically connected to the source/drain pattern on the second lower pattern BP2 may be the same or similar to that of FIG. 2. Although not illustrated, the second backside source/drain contact 270 may be connected to the second backside wiring line 60.

The first frontside source/drain contact 175 may extend to be long in the third direction Z. The first frontside source/drain contact 175 may be connected to the second source/drain pattern 160. For example, the first frontside source/drain contact 175 may be electrically connected to the second source/drain pattern 160.

The first frontside source/drain contact 175 is disposed on the first surface BP1_S1 of the first lower pattern. The first frontside source/drain contact 175 may be disposed within the first frontside interlayer insulating film 190 and the second source/drain pattern 160. A portion of the first frontside source/drain contact 175 may be disposed within the second source/drain pattern 160. The first frontside source/drain contact 175 does not penetrate through the first lower pattern BP1.

A height from the upper surface AP1_US of the first active pattern to an upper surface 175US of the first frontside source/drain contact may be the same as a height from the upper surface AP1_US of the first active pattern to the upper surface 145US of the gate capping pattern.

Although it is illustrated that the first frontside source/drain contact 175 has a single conductive film structure, the present disclosure is not limited thereto. Although not illustrated, the first frontside source/drain contact 175 may have a multi-conductive film structure including a contact liner and a contact plug, like the lower pattern 170B of the first backside source/drain contact.

The first frontside source/drain contact 175 may include, for example, at least one of a metal, conductive metal nitride, conductive metal carbide, conductive oxide, conductive metal carbonitride, and a two-dimensional material.

A shape in which the second frontside source/drain contact 275 is electrically connected to the source/drain pattern on the second lower pattern BP2 may be the same or similar to that of FIG. 2.

A first contact silicide film 155 may be disposed between the first backside source/drain contact 170 and the first source/drain pattern 150. The first contact silicide film 155 is in contact with the first backside source/drain contact 170. The first contact silicide film 155 may be in contact with the upper pattern 170U of the first backside source/drain contact.

A second contact silicide film 165 may be disposed between the first frontside source/drain contact 175 and the second source/drain pattern 160. The second contact silicide film 165 is in contact with the first frontside source/drain contact 175. The first contact silicide film 155 and the second contact silicide film 165 may each include a metal silicide material.

The second frontside interlayer insulating film 191 may be disposed on the first frontside interlayer insulating film 190, the gate structure GS, and the first frontside source/drain contact 175. Although not illustrated, the second frontside interlayer insulating film 191 may be disposed on the second frontside source/drain contact 275. The second frontside interlayer insulating film 191 may include, for example, at least one of silicon oxide, silicon nitride, silicon carbonitride, silicon oxynitride, and a low-k material.

The frontside wiring structure 195 may be disposed within the second frontside interlayer insulating film 191. The frontside wiring structure 195 is disposed on the first surface 50_S1 of the first backside wiring line and the first surface 60_S1 of the second backside wiring line. The frontside wiring structure 195 may include a frontside via plug 196 and a frontside wiring line 197.

The frontside wiring structure 195 may be connected to the first frontside source/drain contact 175. The frontside wiring structure 195 may be connected to the upper surface 175US of the first frontside source/drain contact.

The first frontside source/drain contact 175 may be disposed between the frontside wiring structure 195 and the second source/drain pattern 160. The first frontside source/drain contact 175 may connect the frontside wiring structure 195 and the second source/drain pattern 160. The first frontside source/drain contact 175 may be connected to the frontside wiring line 197. For example, the frontside wiring structure 195 may not be connected to the first source/drain pattern 150 connected to the first backside source/drain contact 170.

Although not illustrated, the frontside wiring structure 195 may be connected to the first source/drain pattern 150 through another frontside source/drain contact. That is, the frontside wiring structure 195 may be connected to the first backside source/drain contact 170 via the first source/drain pattern 150.

The frontside via plug 196 and the frontside wiring line 197 may each include, for example, at least one of a metal, conductive metal nitride, conductive metal carbide, conductive metal oxide, conductive metal carbonitride, and a two-dimensional material.

Although it is illustrated that the frontside via plug 196 and the frontside wiring line 197 each have a single conductive film structure, it is merely for convenience of explanation, and the present disclosure is not limited thereto. Although not illustrated, for example, at least one of the frontside via plug 196 and the frontside wiring line 197 may have a multi-conductive film structure. As another example, the frontside wiring structure 195 may have an integrated structure with no interface separation between the frontside via plug 196 and the frontside wiring line 197.

FIGS. 7 to 10 are views for describing a semiconductor device according to some example embodiments. For convenience of explanation, points different from those described with reference to FIGS. 1 to 6 will be mainly described. For reference, FIGS. 7 to 10 are enlarged views of part Q of FIG. 2, respectively.

Figure 7:
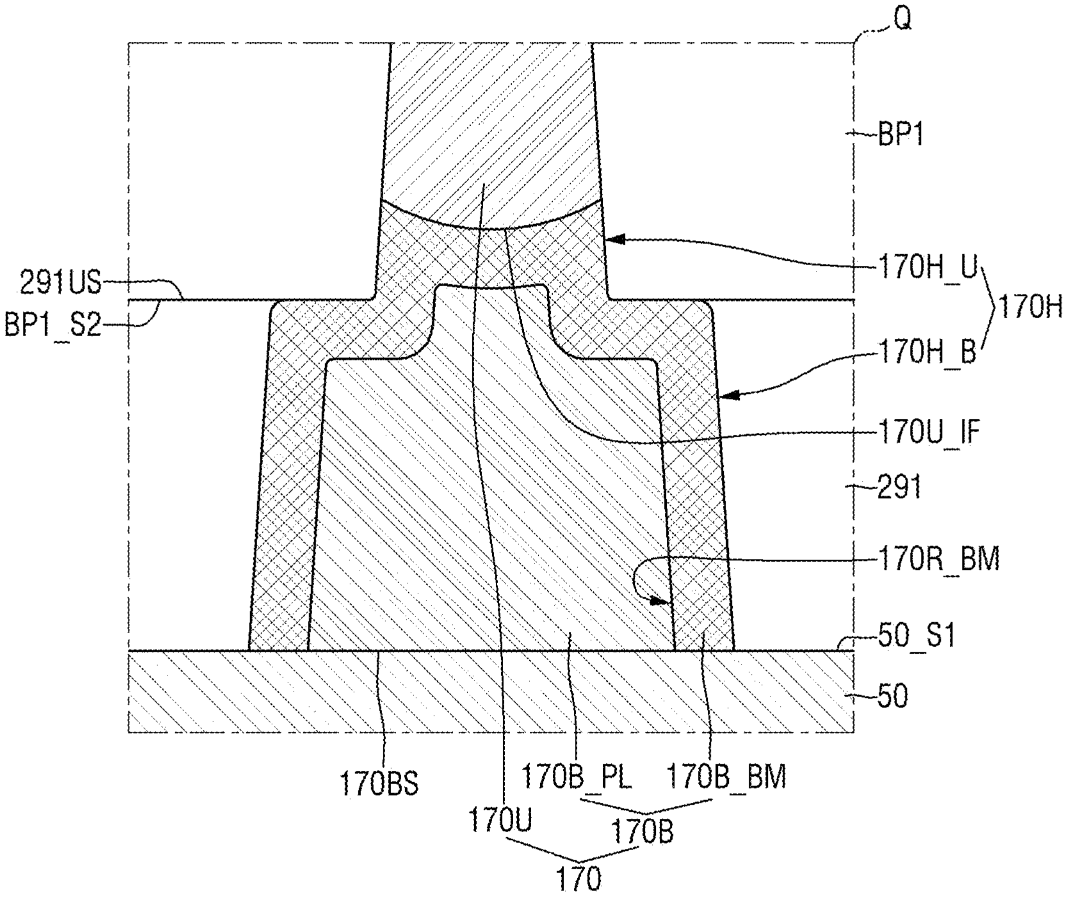
FIGS. 7 to 10 are views for describing a semiconductor device according to some example embodiments.

Referring to FIGS. 2 and 7, in the semiconductor device according to some example embodiments, the lower pattern 170B of the first backside source/drain contact may fill a portion of the first backside contact hole 170H_U.

For example, a portion of the lower pattern 170B of the first backside source/drain contact may protrude more toward the first source/drain pattern 150 than the upper surface 291US of the second backside interlayer insulating film.

Figure 8:
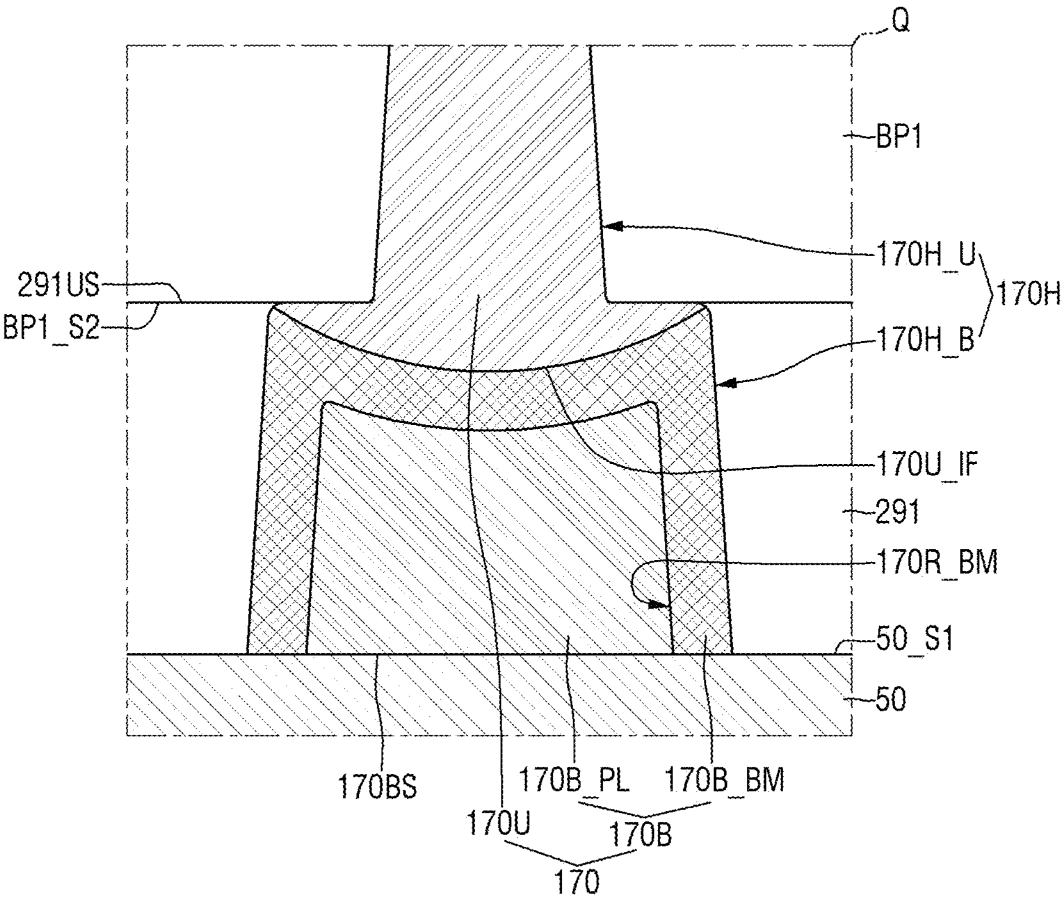

Referring to FIGS. 2 and 8, in the semiconductor device according to some example embodiments, the upper pattern 170U of the first backside source/drain contact may fill a portion of the second backside contact hole 170H_B.

The upper pattern 170U of the first backside source/drain contact may be in contact with at least a portion of the bottom surface of the second backside contact hole 170H_B.

For example, a portion of the upper pattern 170U of the first backside source/drain contact may protrude more toward the first backside wiring line 50 than the second surface BP1_S2 of the first lower pattern.

Figure 9:
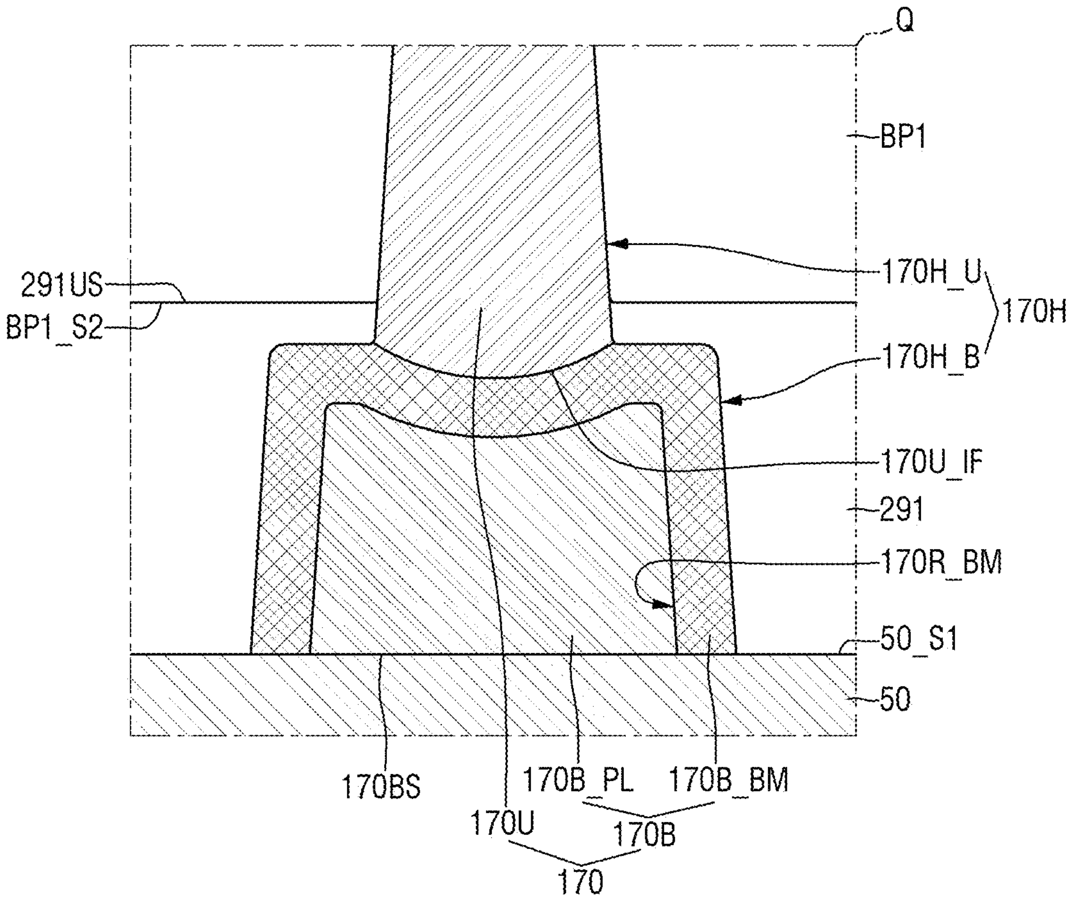

Referring to FIGS. 2 and 9, in the semiconductor device according to some example embodiments, the first backside contact hole 170H_U may be disposed within the second backside interlayer insulating film 291, the first lower pattern BP1, and the first source/drain pattern 150.

For example, the bottom surface of the second backside contact hole 170H_B may be defined by the second backside interlayer insulating film 291.

Figure 10:
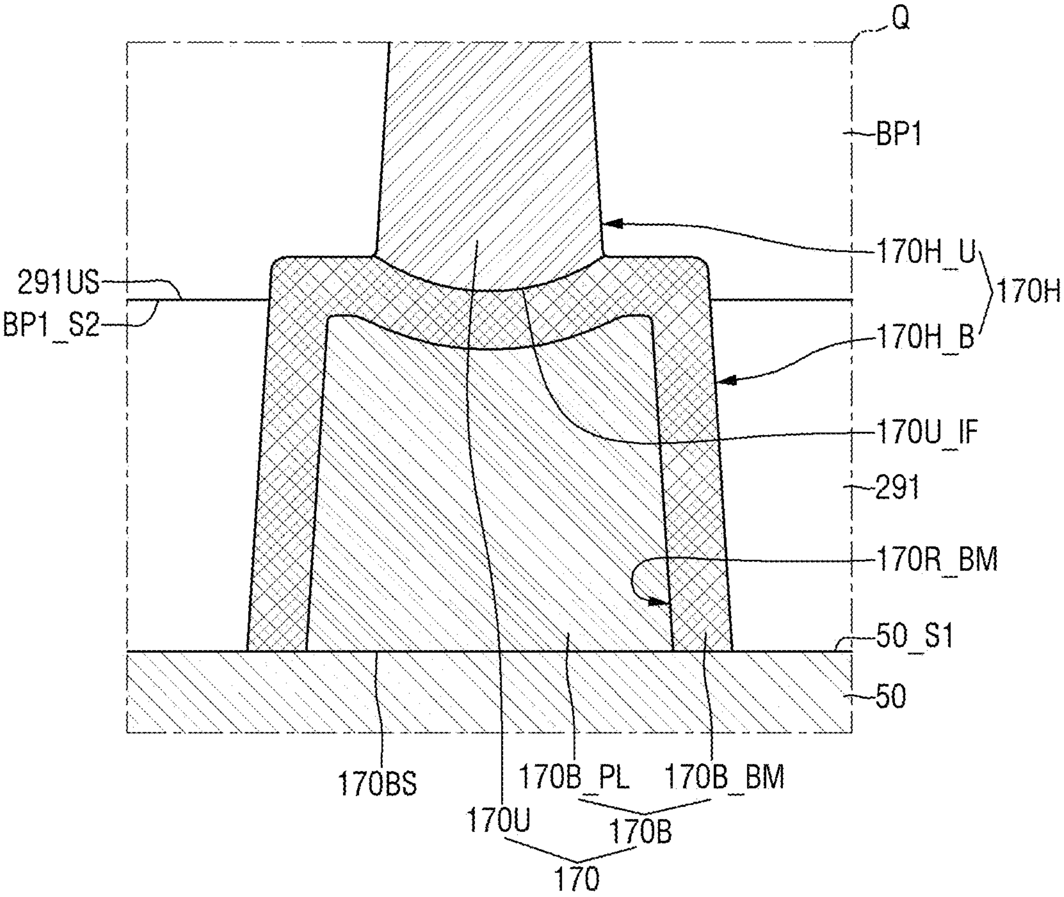

Referring to FIGS. 2 and 10, in the semiconductor device according to some example embodiments, the second backside contact hole 170H_B may be disposed within the second backside interlayer insulating film 291 and the first lower pattern BP1.

A portion of the sidewall of the second backside contact hole 170H_B may be defined by the first lower pattern BP1. The bottom surface of the second backside contact hole 170H_B may be defined by the first lower pattern BP1.

Figure 11:
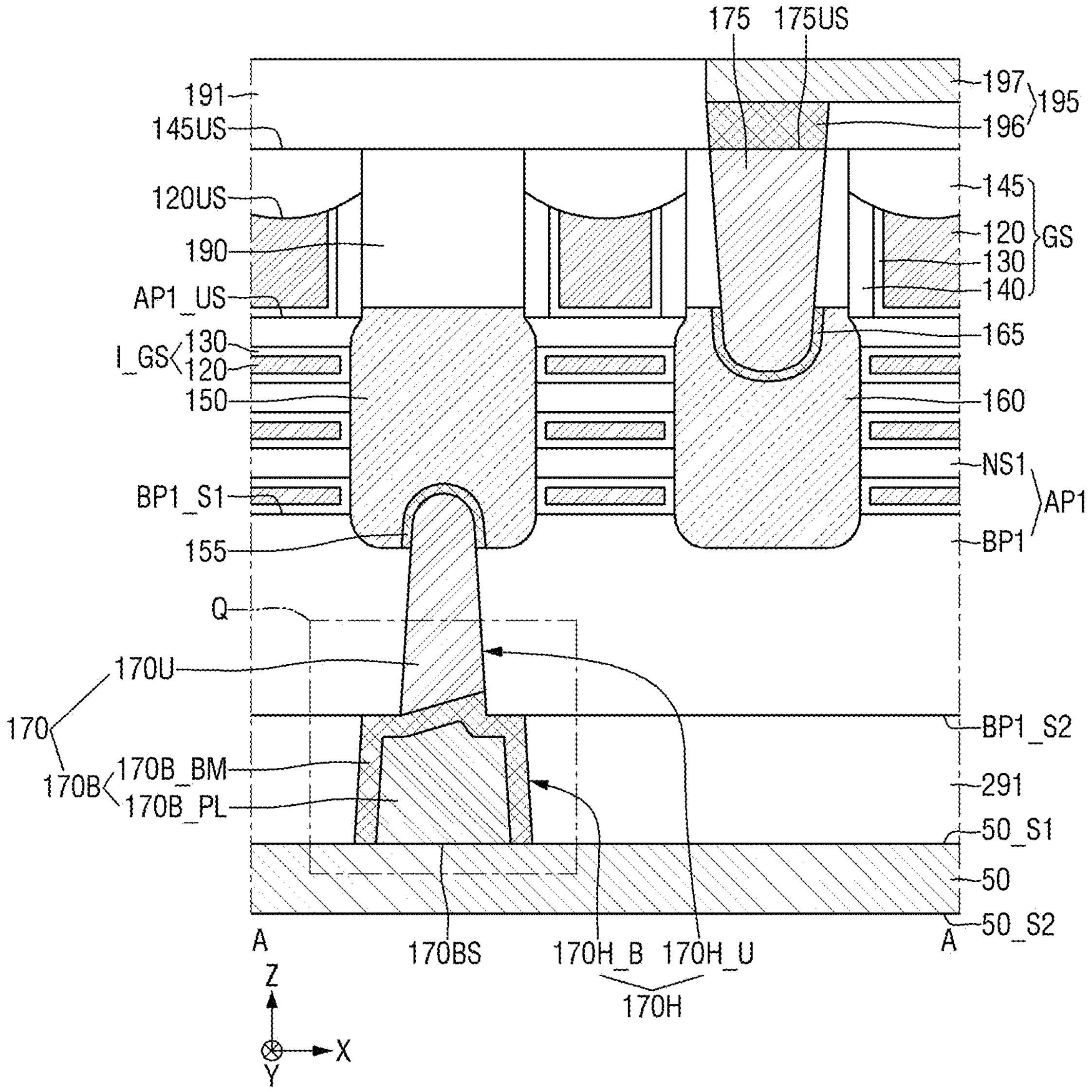
FIGS. 11 to 13 are views for describing a semiconductor device according to some example embodiments.
Figure 12:
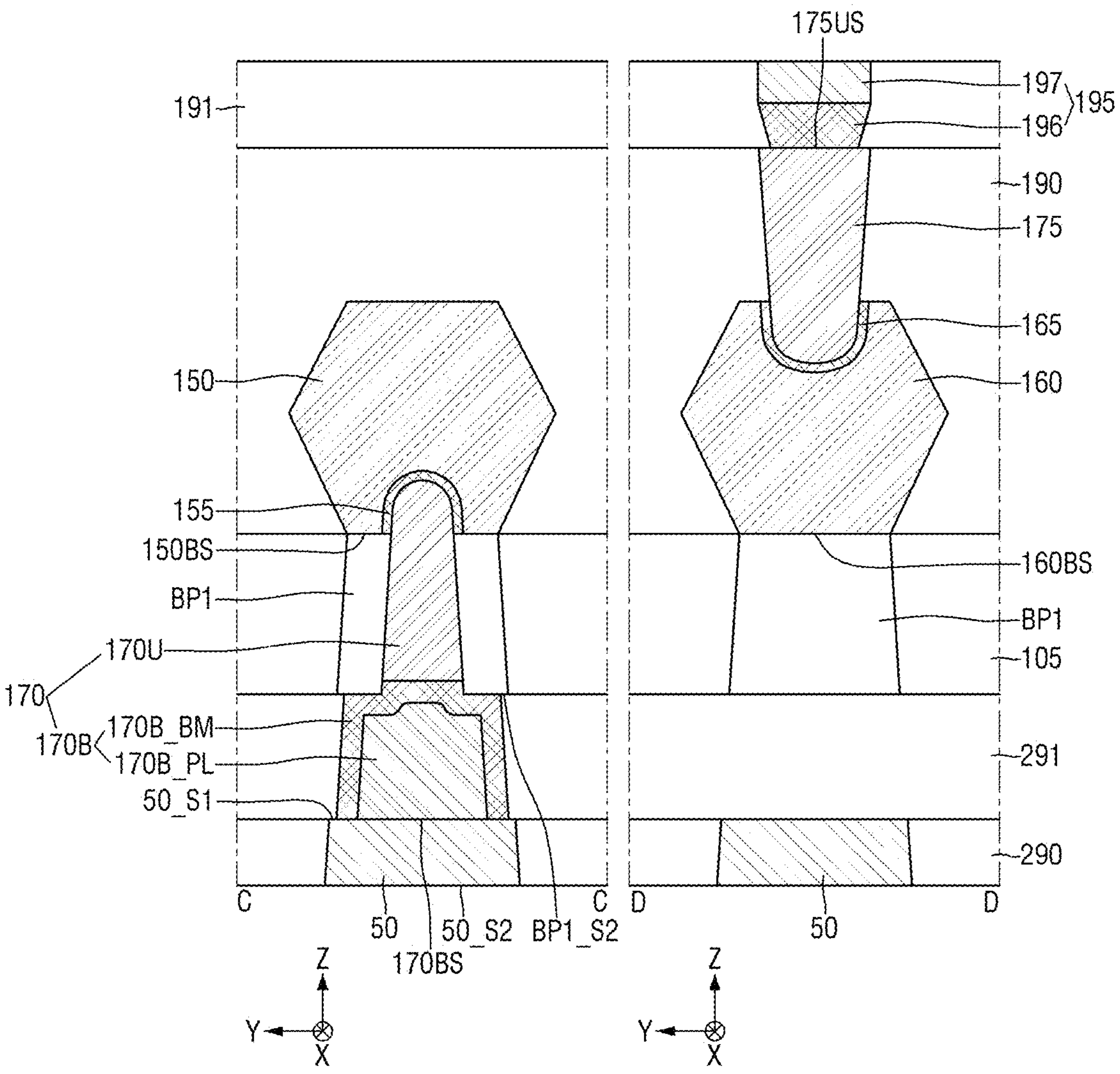
Figure 13:
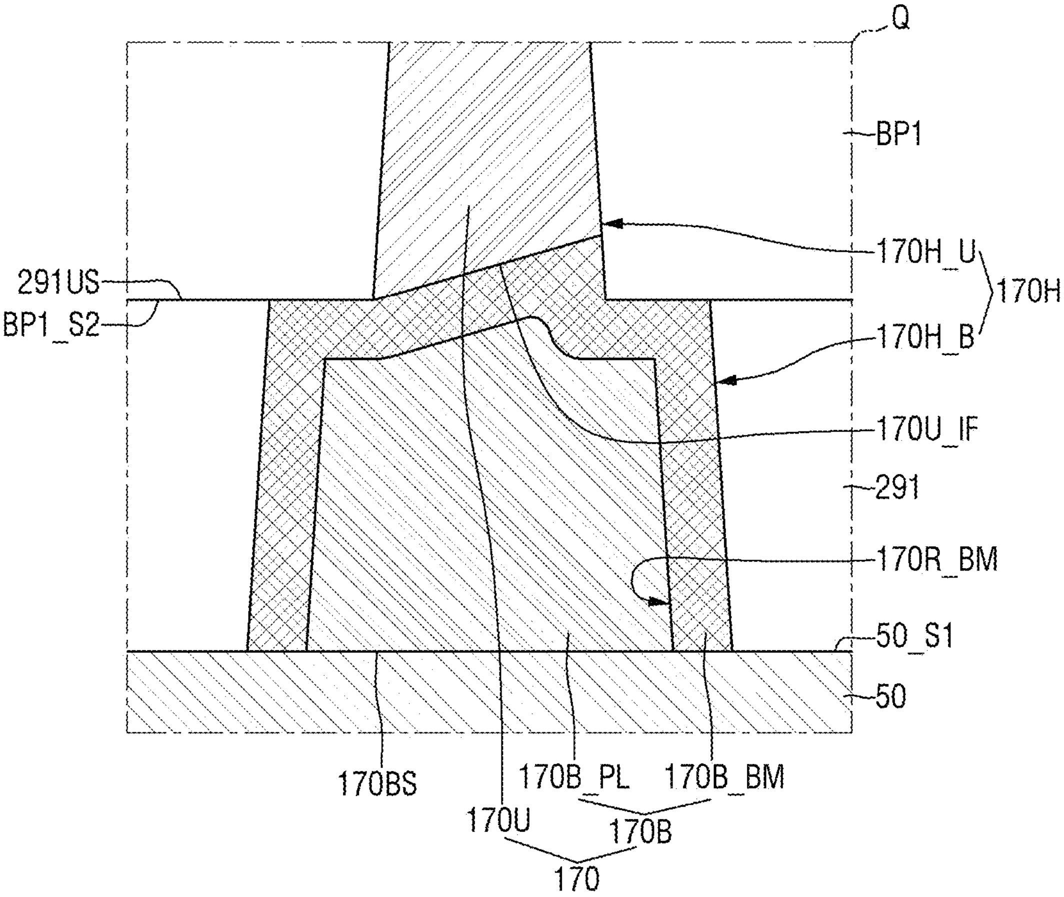
Figure 14:
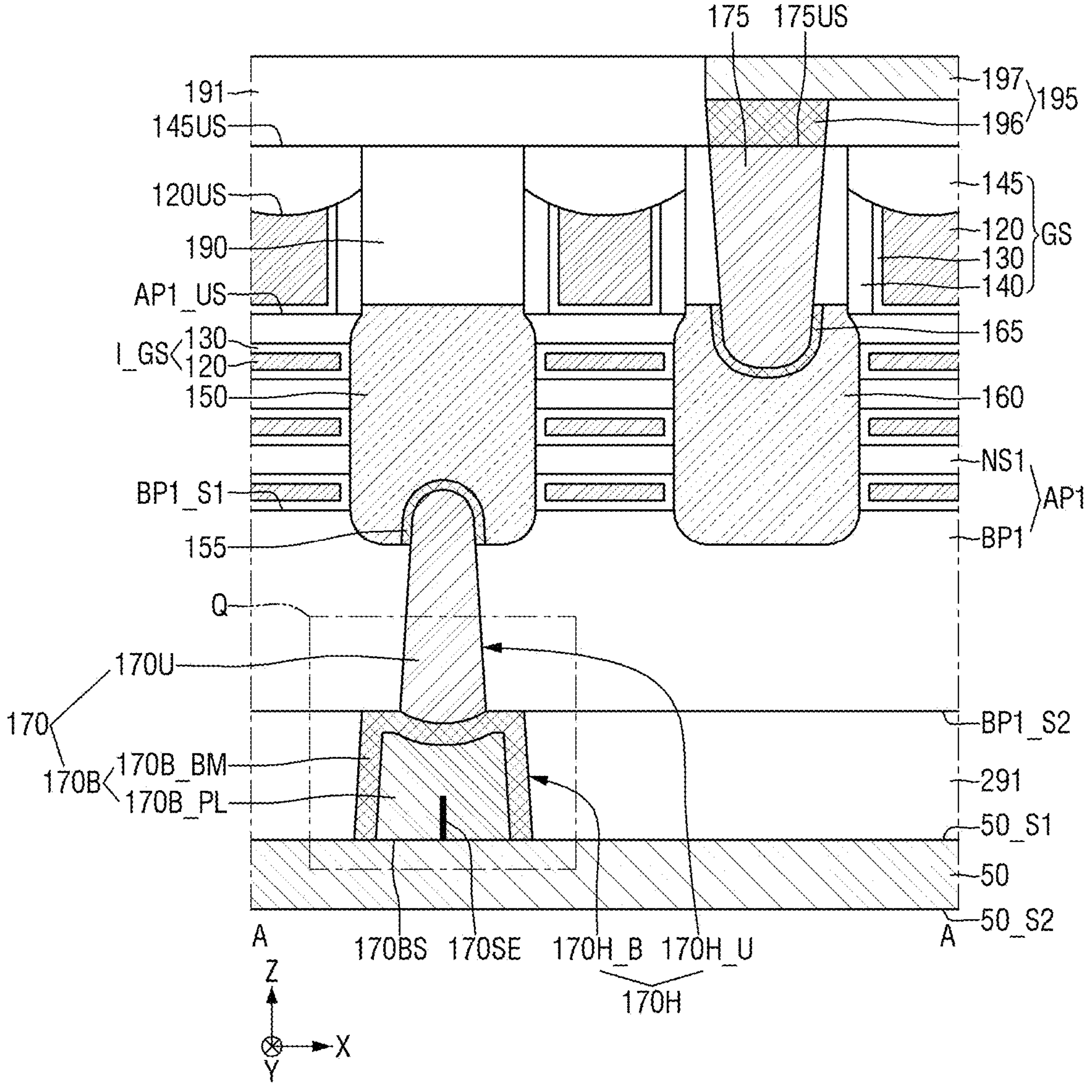
FIGS. 14 and 15 are views for describing a semiconductor device according to some example embodiments.
Figure 15:
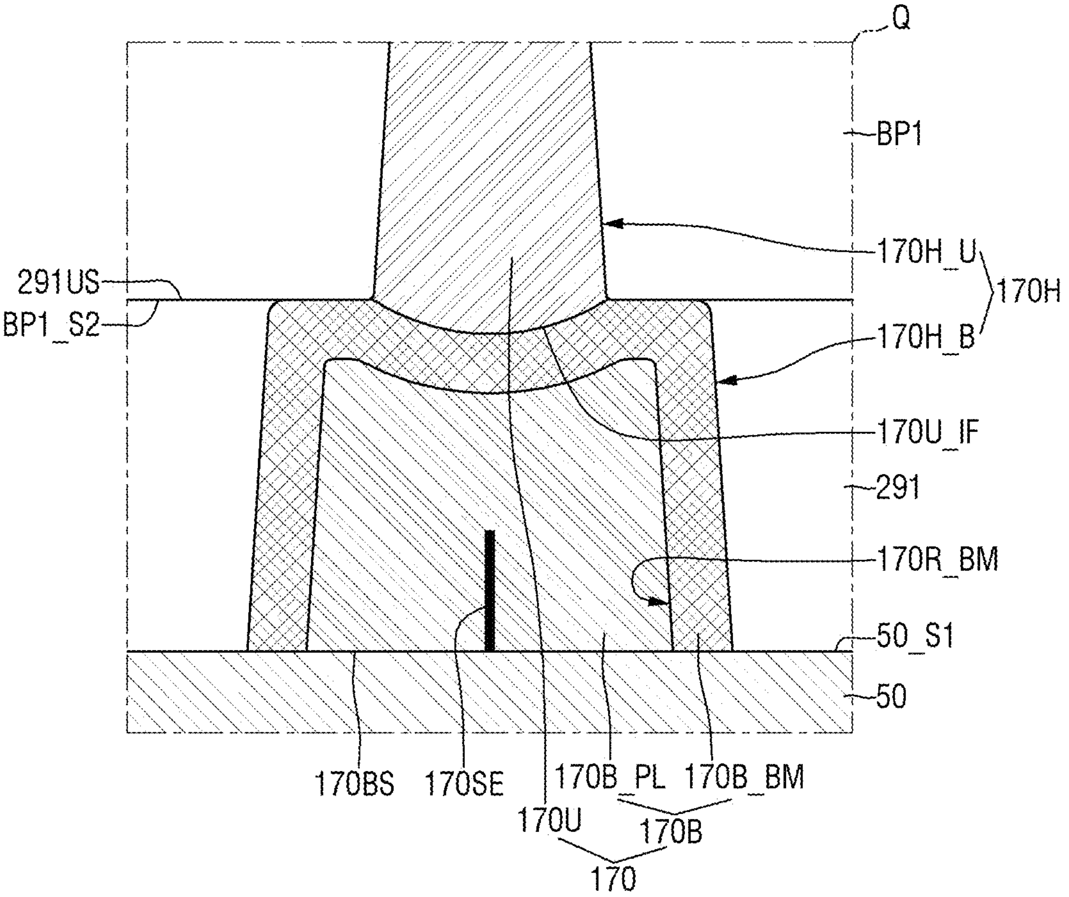

FIGS. 11 to 13 are views for describing a semiconductor device according to some example embodiments. FIGS. 14 and 15 are views for describing a semiconductor device according to some example embodiments. For convenience of explanation, points different from those described with reference to FIGS. 1 to 6 will be mainly described.

For reference, FIG. 13 is an enlarged view of part Q of FIG. 11, and FIG. 15 is an enlarged view of part Q of FIG. 14.

Referring to FIGS. 11 to 13, in the semiconductor device according to some example embodiments, the interface 170U_IF of the upper pattern of the first backside source/drain contact may have an inclined shape.

For example, in a cross-sectional view as illustrated in FIG. 11, the interface 170U_IF of the upper pattern of the first backside source/drain contact may have an inclined shape with respect to the second surface BP1_S2 of the first lower pattern.

A crystal structure of the metal included in the upper pattern 170U of the first backside source/drain contact may affect the shape of the interface 170U_IF of the upper pattern of the first backside source/drain contact. That is, depending on a cutting direction of the first backside source/drain contact 170, the shape of the interface 170U_IF of the upper pattern of the first backside source/drain contact 170 may be different. For example, in a cross-sectional view as illustrated in FIG. 12, the interface 170U_IF of the upper pattern of the first backside source/drain contact may be parallel to the second surface BP1_S2 of the first lower pattern.

Although not illustrated, as an example, in the cross-sectional view as illustrated in FIG. 12, the interface 170U_IF of the upper pattern of the first backside source/drain contact may have an inclined shape with respect to the second surface BP1_S2 of the first lower pattern.

Although not illustrated, as another example, in the cross-sectional view as illustrated in FIG. 11, the interface 170U_IF of the upper pattern of the first backside source/drain contact may be parallel to the second surface BP1_S2 of the first lower pattern. In the cross-sectional view as illustrated in FIG. 12, the interface 170U_IF of the upper pattern of the first backside source/drain contact may have an inclined shape.

Referring to FIGS. 14 and 15, in the semiconductor device according to some example embodiments, the lower pattern 170B of the first backside source/drain contact may include a scam pattern 170SE.

For example, the backside contact plug 170B_PL may include the seam pattern 170SE. Although it is illustrated that the seam pattern 170SE extends to the bottom surface 170BS of the first backside source/drain contact, the present disclosure is not limited thereto.

Figure 16:
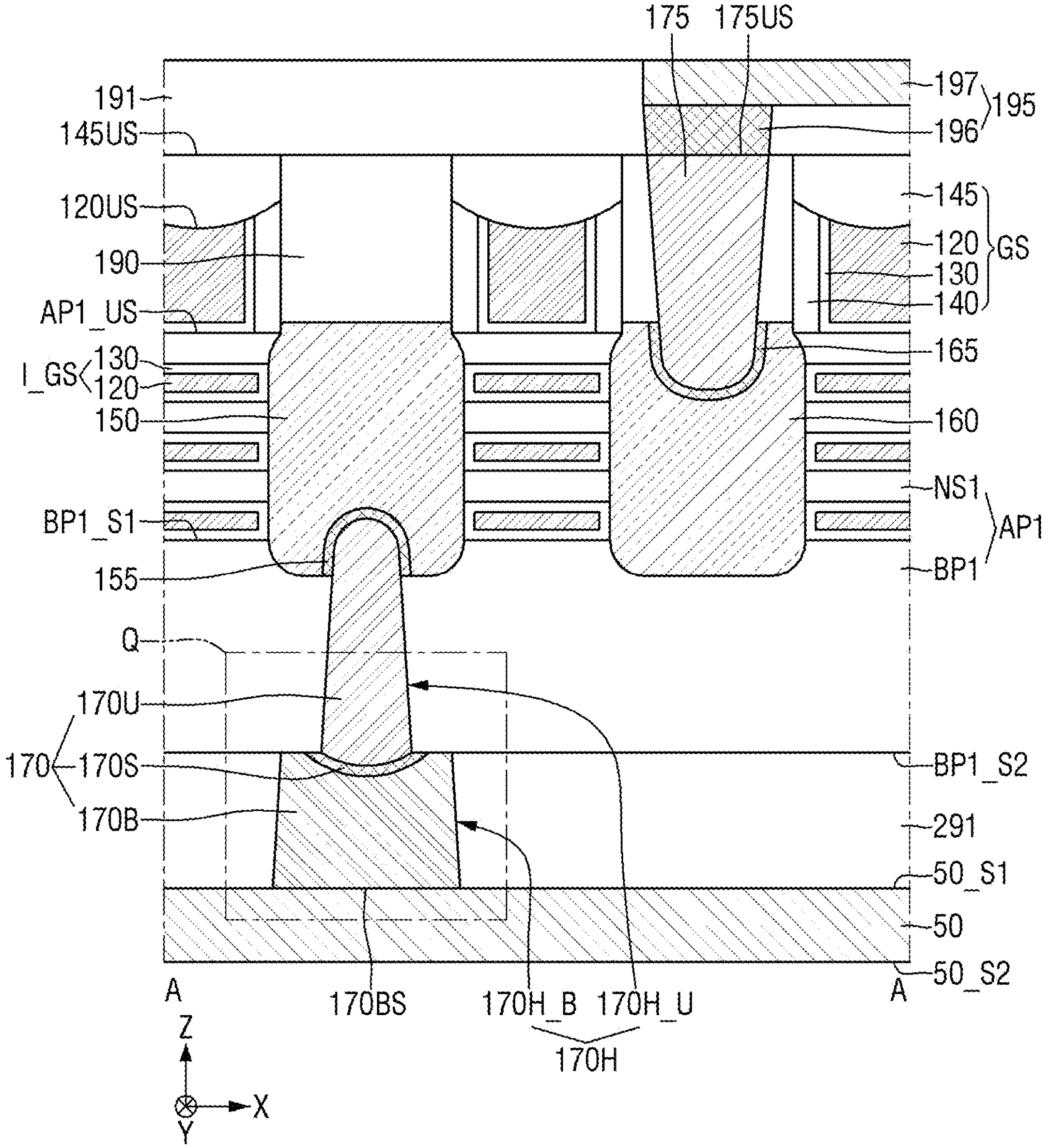
FIGS. 16 to 18 are views for describing a semiconductor device according to some example embodiments.
Figure 17:
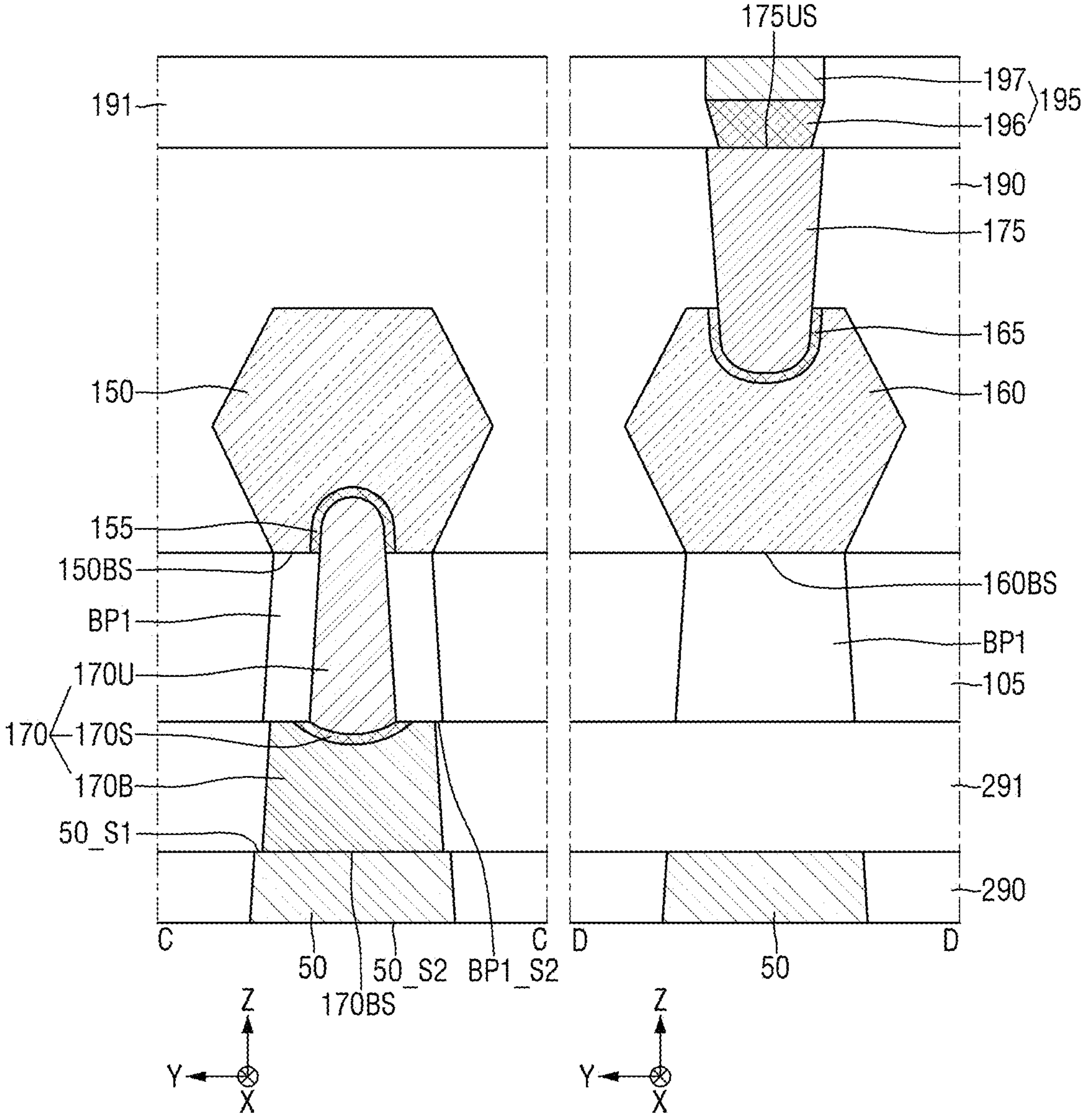
Figure 18:
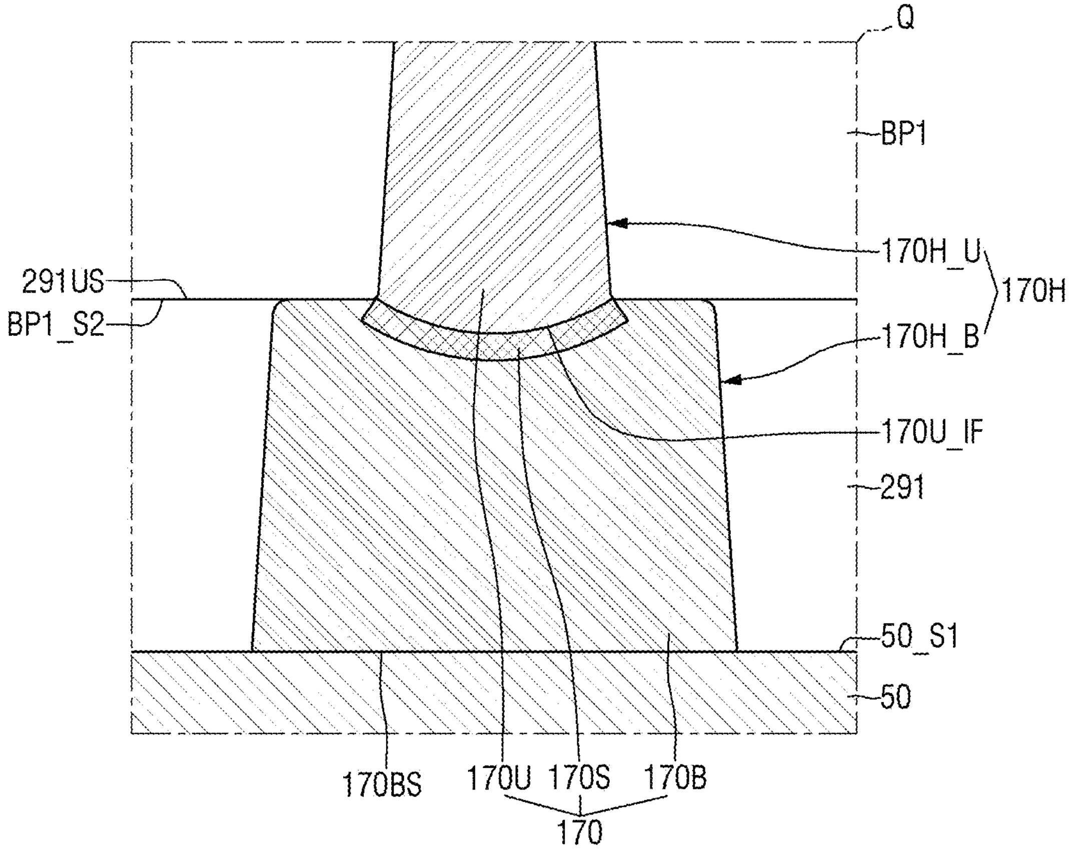
Figure 19:
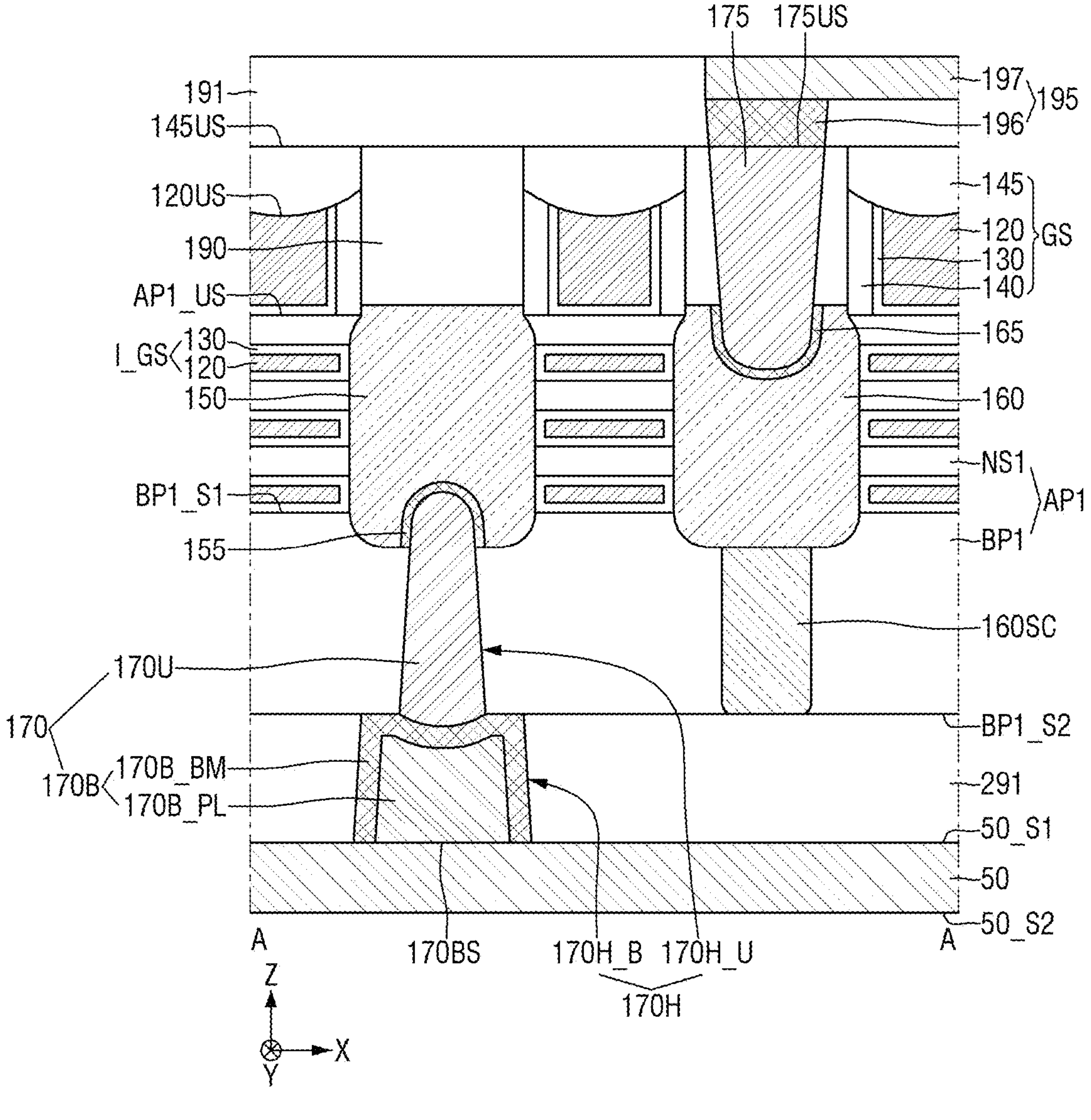
FIGS. 19 and 20 are views for describing a semiconductor device according to some example embodiments.
Figure 20:
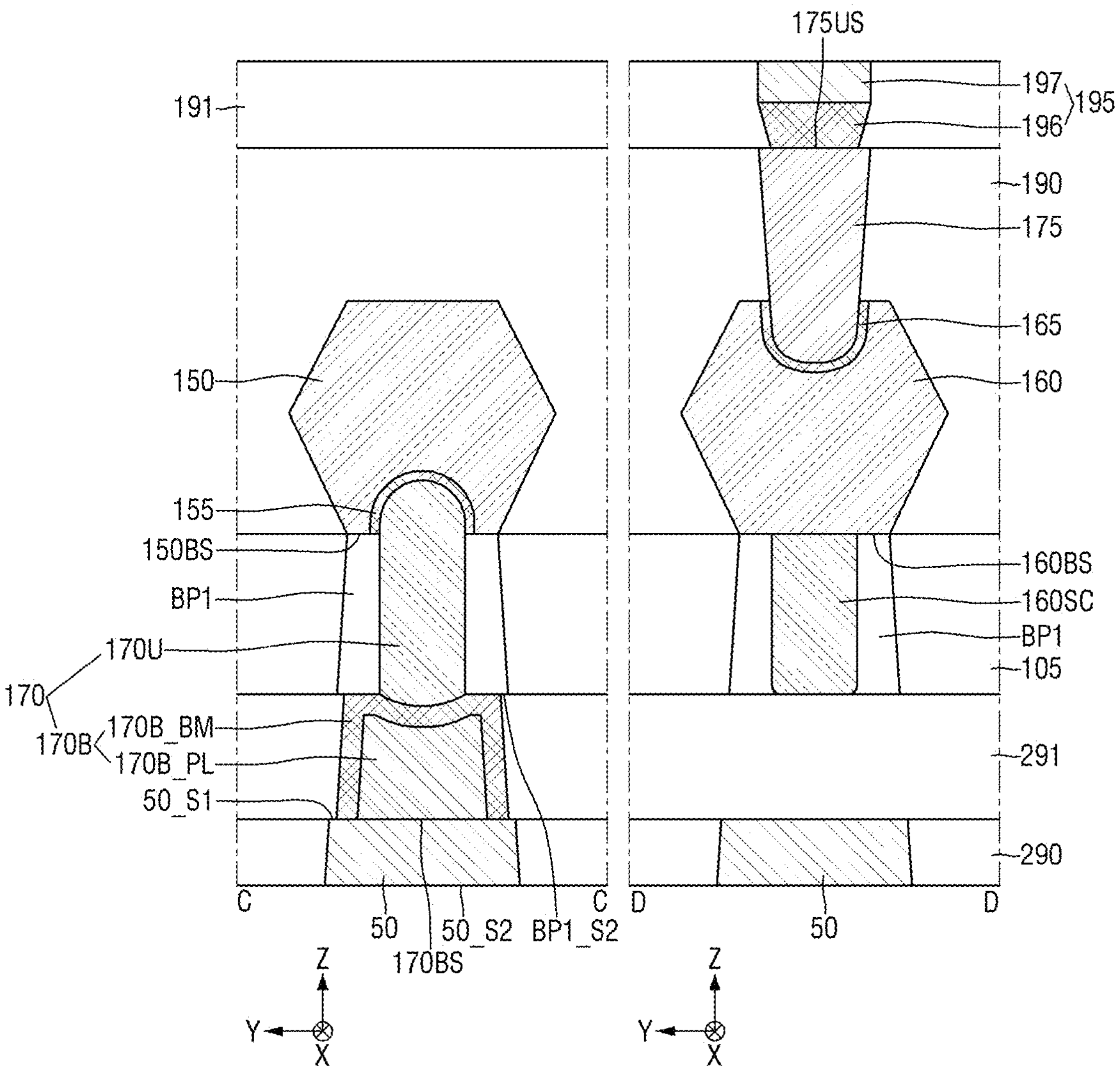

FIGS. 16 to 18 are views for describing a semiconductor device according to some example embodiments. FIGS. 19 and 20 are views for describing a semiconductor device according to some example embodiments. For convenience of explanation, points different from those described with reference to FIGS. 1 to 6 will be mainly described.

Referring to FIGS. 16 to 18, in the semiconductor device according to some example embodiments, the lower pattern 170B of the first backside source/drain contact may have a single conductive film structure.

The first backside source/drain contact 170 may further include a contact capping pattern 170S disposed between the lower pattern 170B of the first backside source/drain contact and the upper pattern 170U of the first backside source/drain contact. For example, the contact capping pattern 170S is in contact with the lower pattern 170B of the first backside source/drain contact and the upper pattern 170U of the first backside source/drain contact.

The contact capping pattern 170S may extend along the interface 170U_IF of the upper pattern of the first backside source/drain contact. For example, the contact capping pattern 170S may be formed only on the interface 170U_IF of the upper pattern of the first backside source/drain contact.

The lower pattern 170B of the first backside source/drain contact may include, for example, one of tungsten (W), molybdenum (Mo), ruthenium (Ru), cobalt (Co), iridium (Ir), and copper (Cu), but is not limited thereto. As an example, the lower pattern 170B of the first backside source/drain contact may include a different metal than the upper pattern 170U of the first backside source/drain contact. The lower pattern 170B of the first backside source/drain contact may include the same metal as the upper pattern 170U of the first backside source/drain contact.

The contact capping pattern 170S may include, for example, one of metal oxide and metal nitride. The metal oxide included in the contact capping pattern 170S may be an oxide of the metal included in the upper pattern 170U of the first backside source/drain contact. The metal nitride included in the contact capping pattern 170S may be nitride of the metal included in the upper pattern 170U of the first backside source/drain contact. For example, when the upper pattern 170U of the first backside source/drain contact includes molybdenum (Mo), the contact capping pattern 170S may include one of molybdenum oxide and molybdenum nitride.

Referring to FIGS. 19 and 20, the semiconductor device according to some example embodiments may further include a sacrificial epitaxial pattern 160SC.

The sacrificial epitaxial pattern 160SC may be disposed between the second source/drain pattern 160 and the first backside wiring line 50. For example, the sacrificial epitaxial pattern 160SC may be disposed between the second source/drain pattern 160 and the second backside interlayer insulating film 291. For example, the sacrificial epitaxial pattern 160SC may be in contact with the second backside interlayer insulating film 291.

For example, the sacrificial epitaxial pattern 160SC may be disposed below the source/drain pattern that is not connected to the backside source/drain contact. That is, the sacrificial epitaxial pattern 160SC may be disposed below the second source/drain pattern 160 that is not connected to the first backside source/drain contact 170.

The sacrificial epitaxial pattern 160SC may include a semiconductor material having an etch selectivity with respect to the first lower pattern BP1. When the first lower pattern BP1 is a silicon fin-type pattern, the sacrificial epitaxial pattern 160SC may include silicon-germanium. For example, the sacrificial epitaxial pattern 160SC may be a silicon-germanium pattern.

Figure 21:
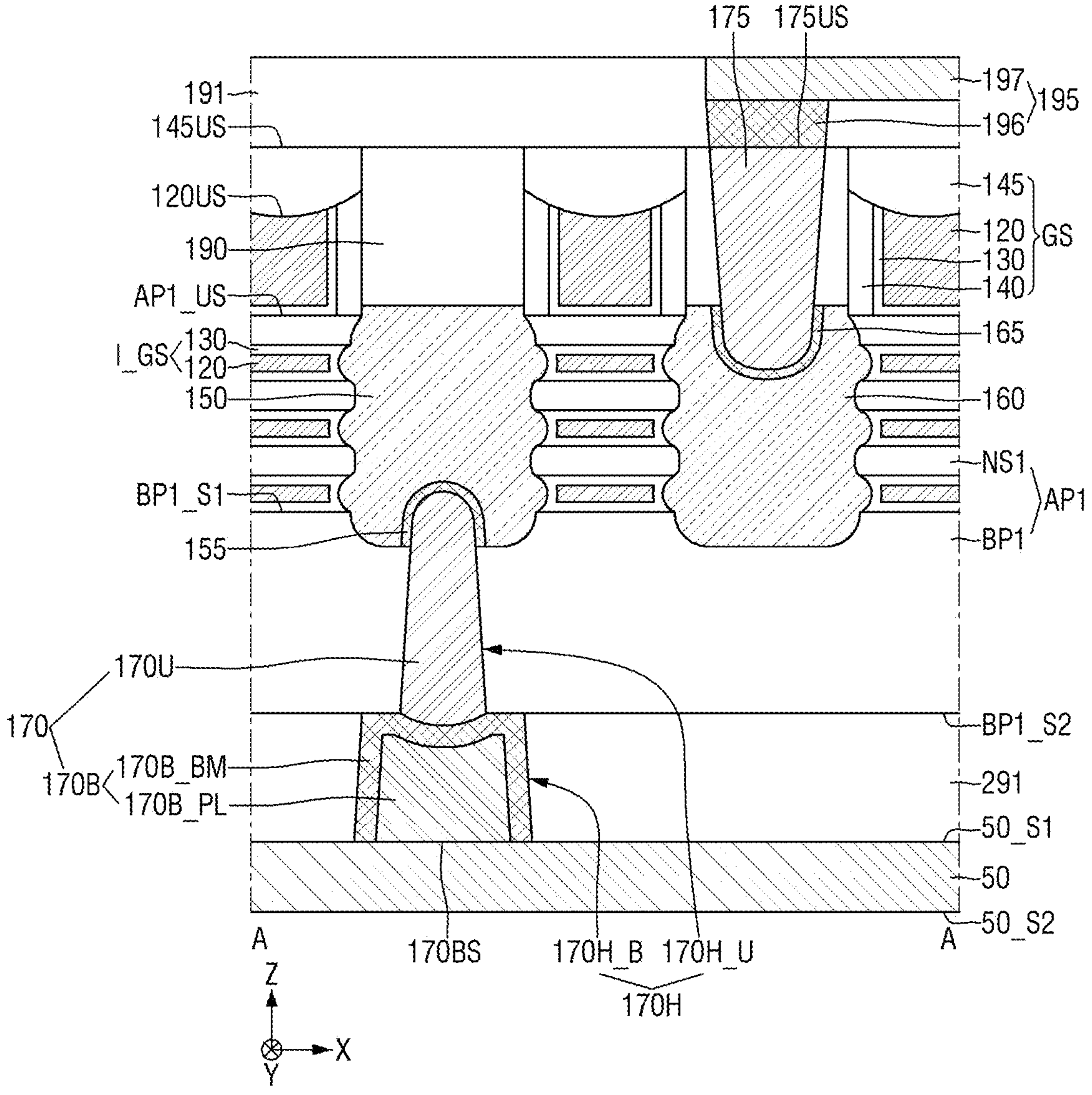
FIGS. 21 to 23 are views for describing a semiconductor device according to some example embodiments.
Figure 22:
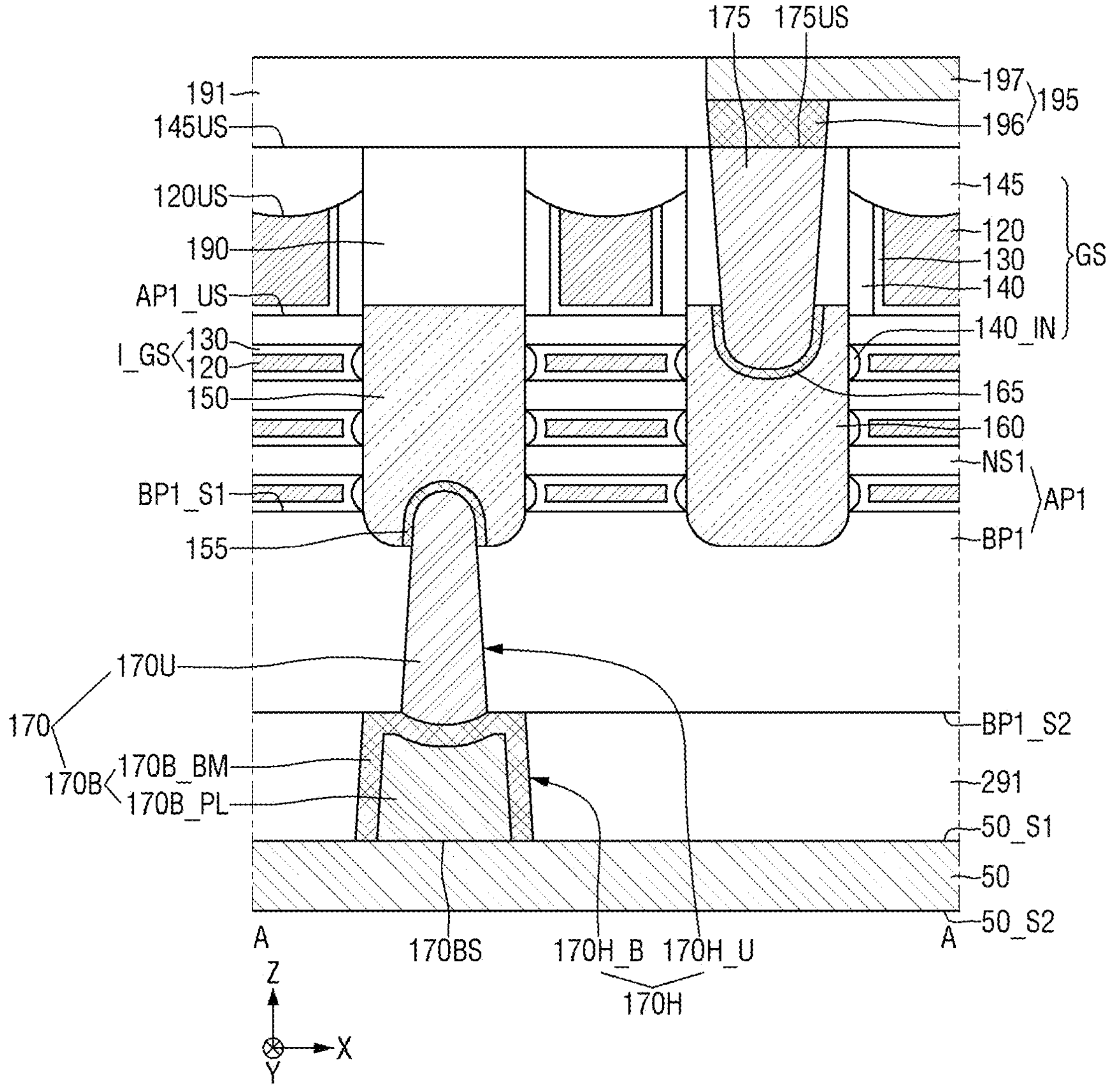
Figure 23:
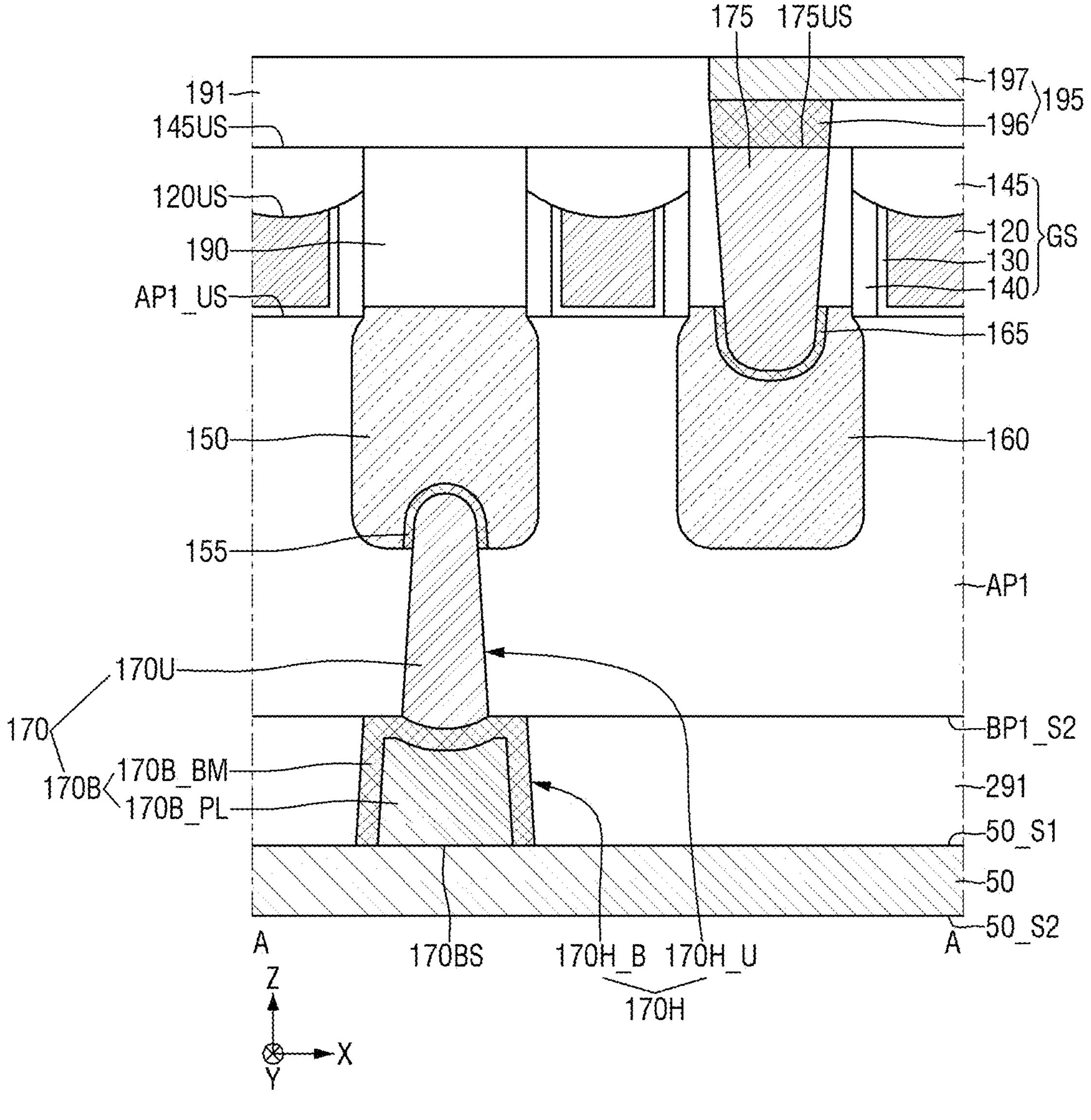

FIGS. 21 to 23 are views for describing a semiconductor device according to some example embodiments. For convenience of explanation, points different from those described with reference to FIGS. 1 to 6 will be mainly described.

Referring to FIG. 21, in the semiconductor device according to some example embodiments, the first source/drain pattern 150 and the second source/drain pattern 160 may include outer sidewalls in contact with the first sheet pattern NS1 and the inner gate structure I_GS.

The outer sidewall of the first source/drain pattern 150 and the outer sidewall of the second source/drain pattern 160 may have a wavy shape.

Referring to FIG. 22, in the semiconductor device according to some example embodiments, the gate structure GS may further include a plurality of inner spacers 140IN.

The inner spacers 140IN may be disposed between the first sheet patterns NS1 adjacent to each other in the third direction Z and between the first lower pattern BP1 and the first sheet pattern NS1. The inner spacer 140IN is disposed between the inner gate structure I_GS and the first source/drain pattern 150. The inner spacer 140IN is disposed between the inner gate structure I_GS and the second source/drain pattern 160.

The inner gate structure I_GS may not be in contact with the first source/drain pattern 150. The inner gate structure I_GS may not be in contact with the second source/drain pattern 160.

For example, the first source/drain pattern 150 and the second source/drain pattern 160 may include an n-type dopant.

Referring to FIG. 23, in the semiconductor device according to some example embodiments, the first active pattern AP1 may not include the first sheet pattern (NS1 in FIG. 2).

The inner gate structure (I_GS in FIG. 2) is not disposed between the first source/drain pattern 150 and the second source/drain pattern 160, but otherwise FIG. 23 may be similar to FIG. 3.

Figure 24:
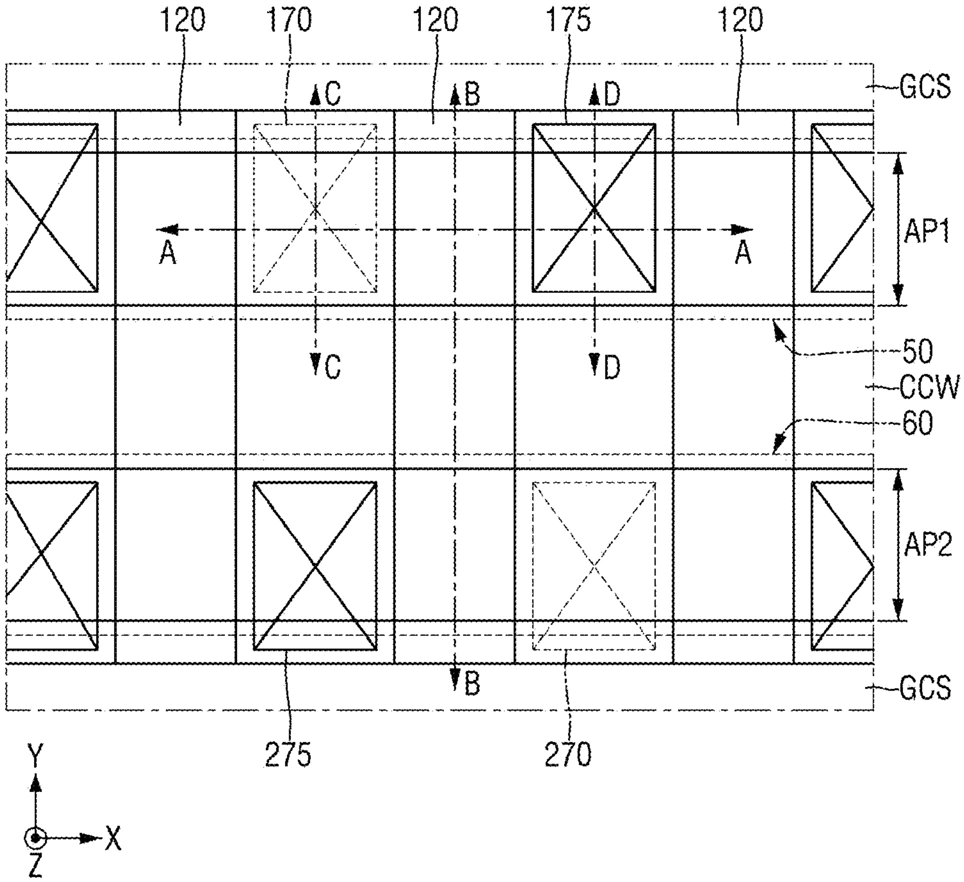
FIGS. 24 to 26 are views for describing a semiconductor device according to some example embodiments.
Figure 25:
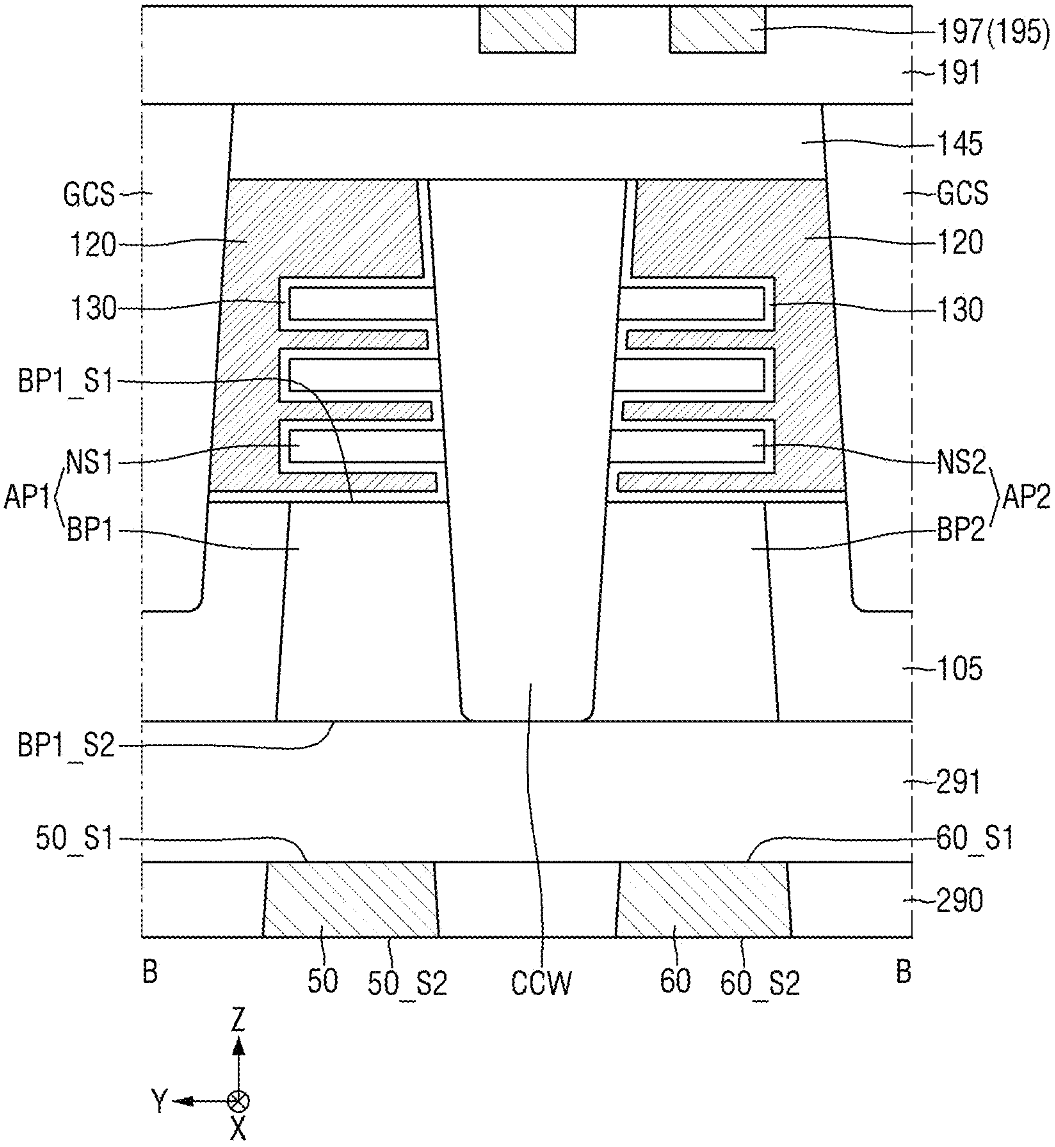
Figure 26:
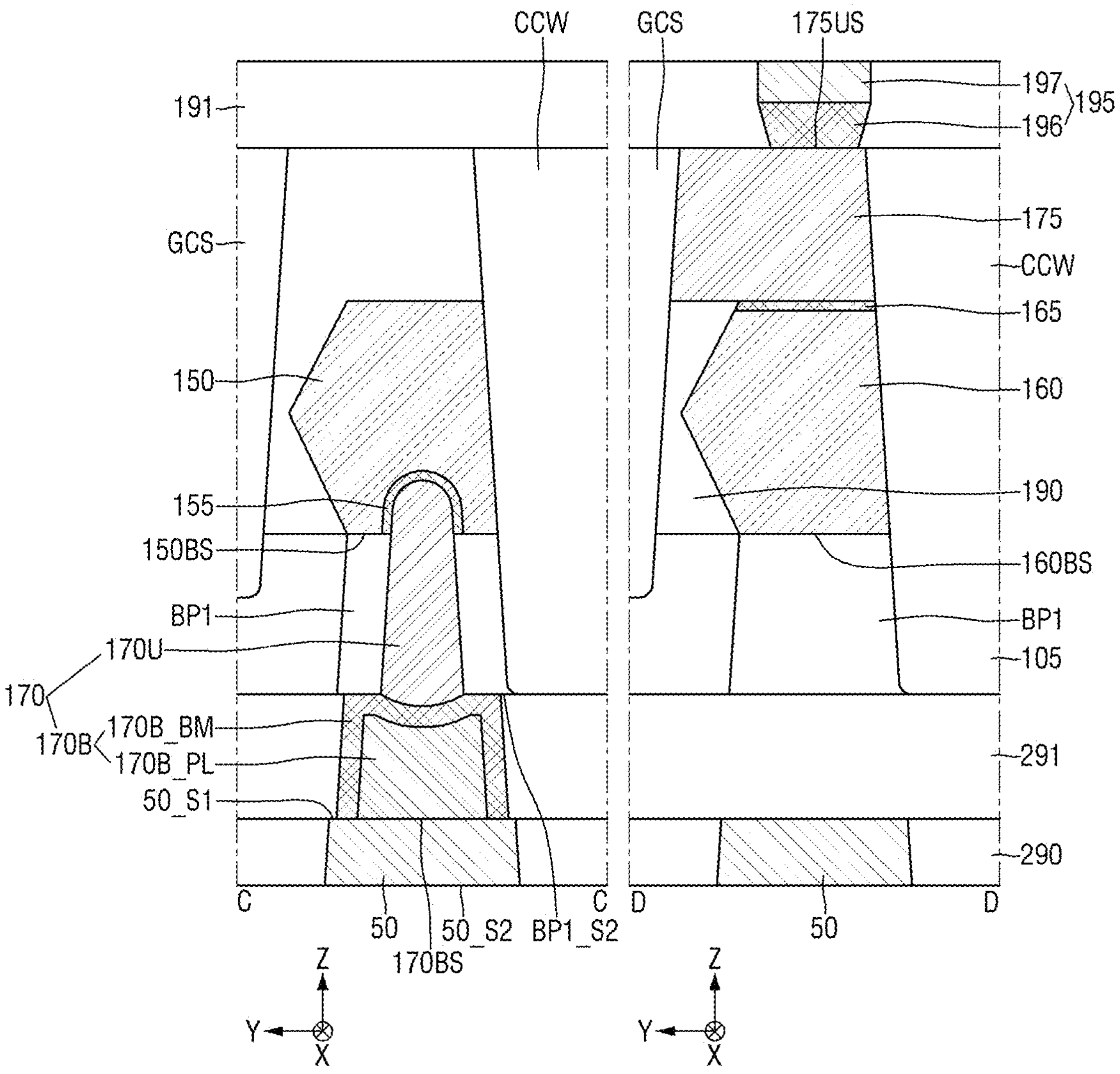

FIGS. 24 to 26 are views for describing a semiconductor device according to some example embodiments. For convenience of explanation, points different from those described with reference to FIGS. 1 to 6 will be mainly described.

For reference, FIG. 24 is an example layout view for describing a semiconductor device according to some example embodiments. FIG. 25 is a cross-sectional view taken along line B-B of FIG. 24. FIG. 26 is a cross-sectional view taken along lines C-C and D-D of FIG. 24. In FIG. 24, a cross-sectional view taken along the first active pattern AP1 may be the same or similar to FIG. 2.

Referring to 24 to 26, the semiconductor device according to some example embodiments may further include a channel separation structure CCW and a gate separation structure GCS.

The channel separation structure CCW may be disposed on the first surface 50_S1 of the first backside wiring line and the first surface 60_S1 of the second backside wiring line. For example, the channel separation structure CCW may be disposed on the second backside interlayer insulating film 291. The channel separation structure CCW may be disposed between the first lower pattern BP1 and the second lower pattern BP2. The channel separation structure CCW may extend in the first direction X.

The channel separation structure CCW may separate the first lower pattern BP1 and the second lower pattern BP2 from each other. The channel separation structure CCW may be in contact with the second backside interlayer insulating film 291. The channel separation structure CCW may separate the first sheet pattern NS1 and the second sheet pattern NS2 from each other. The first lower pattern BP1 and the second lower pattern BP2 cover a portion of a sidewall of the channel separation structure CCW. The sidewall of the channel separation structure CCW may extend in the first direction X.

Although not illustrated, the channel separation structure CCW may not be in contact with the second backside interlayer insulating film 291. The first lower pattern BP1 and the second lower pattern BP2 may be connected by a semiconductor material.

The first lower pattern BP1 and the second lower pattern BP2 may include first and second sidewalls that are opposite to each other in the second direction Y. The first sidewall of the first lower pattern BP1 faces the first sidewall of the second lower pattern BP2. The channel separation structure CCW may be in contact with the first lower pattern BP1 and the second lower pattern BP2. The channel separation structure CCW may be in contact with the first sidewall of the first lower pattern BP1 and the first sidewall of the second lower pattern BP2. The field insulating film 105 may be in contact with the second sidewall of the first lower pattern BP1 and the second sidewall of the second lower pattern BP2.

The plurality of first sheet patterns NS1 and the plurality of second sheet patterns NS2 are in contact with the channel separation structure CCW. The first sheet pattern NS1 and the second sheet pattern NS2 may protrude from the sidewall of the channel separation structure CCW in the second direction Y.

In a cross-sectional view as illustrated in FIG. 25, the gate capping pattern 145 may be disposed on the channel separation structure CCW, but is not limited thereto. Although not illustrated, an upper surface of the channel separation structure CCW may be on the same plane as an upper surface of the gate capping pattern 145.

The channel separation structure CCW includes an insulating material. The channel separation structure CCW may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide (AlO), and a combination thereof. Although it is illustrated that the channel separation structure CCW is a single film, this is merely for convenience of explanation, and the present disclosure is not limited thereto.

The gate separation structure GCS may be disposed on the first surface 50_S1 of the first backside wiring line and the first surface 60_S1 of the second backside wiring line. For example, the gate separation structure GCS may be disposed on the second backside interlayer insulating film 291. The gate separation structure GCS may extend in the first direction X. The gate separation structure GCS may be disposed on the field insulating film 105. A portion of the gate separation structure GCS may be disposed within the first frontside interlayer insulating film 190.

The gate separation structure GCS may be in contact with the field insulating film 105. The gate separation structure GCS may protrude more in the third direction Z than the upper surface of the field insulating film 105. For example, a portion of the gate separation structure GCS may be recessed into the field insulating film 105.

The channel separation structure CCW may be disposed between the gate separation structures GCS adjacent to each other in the second direction Y. Although not illustrated, the gate separation structure GCS may be disposed between the channel separation structures CCW adjacent to each other in the second direction Y. The plurality of first sheet patterns NS1 and the plurality of second sheet patterns NS2 are disposed between the channel separation structures CCW and the gate separation structures GCS adjacent to each other in the second direction Y.

For example, the gate separation structure GCS may not extend to the second backside interlayer insulating film 291. The gate separation structure GCS may not be in contact with the second backside interlayer insulating film 291. Although not illustrated, the gate separation structure GCS may be in contact with the second backside interlayer insulating film 291.

The gate separation structure GCS includes an insulating material. The gate separation structure GCS may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide (AlO), and a combination thereof. Although it is illustrated that the gate separation structure GCS is a single film, this is merely for convenience of explanation, and the present disclosure is not limited thereto.

The gate electrode 120 and the gate insulating film 130 may be disposed between the channel separation structure CCW and the gate separation structure GCS. Since the first sheet pattern NS1 and the second sheet pattern NS2 are in contact with the channel separation structure CCW, the gate electrode 120 and the gate insulating film 130 do not surround each first sheet pattern NS1 in a cross-sectional view.

The first source/drain pattern 150 and the second source/drain pattern 160 may be disposed between the channel separation structure CCW and the gate separation structure GCS. For example, the first source/drain pattern 150 and the second source/drain pattern 160 may be in contact with the sidewall of the channel separation structure CCW.

For example, the first source/drain pattern 150 and the second source/drain pattern 160 may dopants of the same conductivity type.

FIGS. 27 to 33 are intermediate operation views for describing a method for manufacturing a semiconductor device according to some example embodiments. For reference, FIGS. 27 to 33 may be a method for manufacturing the semiconductor device described with reference to FIGS. 1 to 6.

Figure 27:
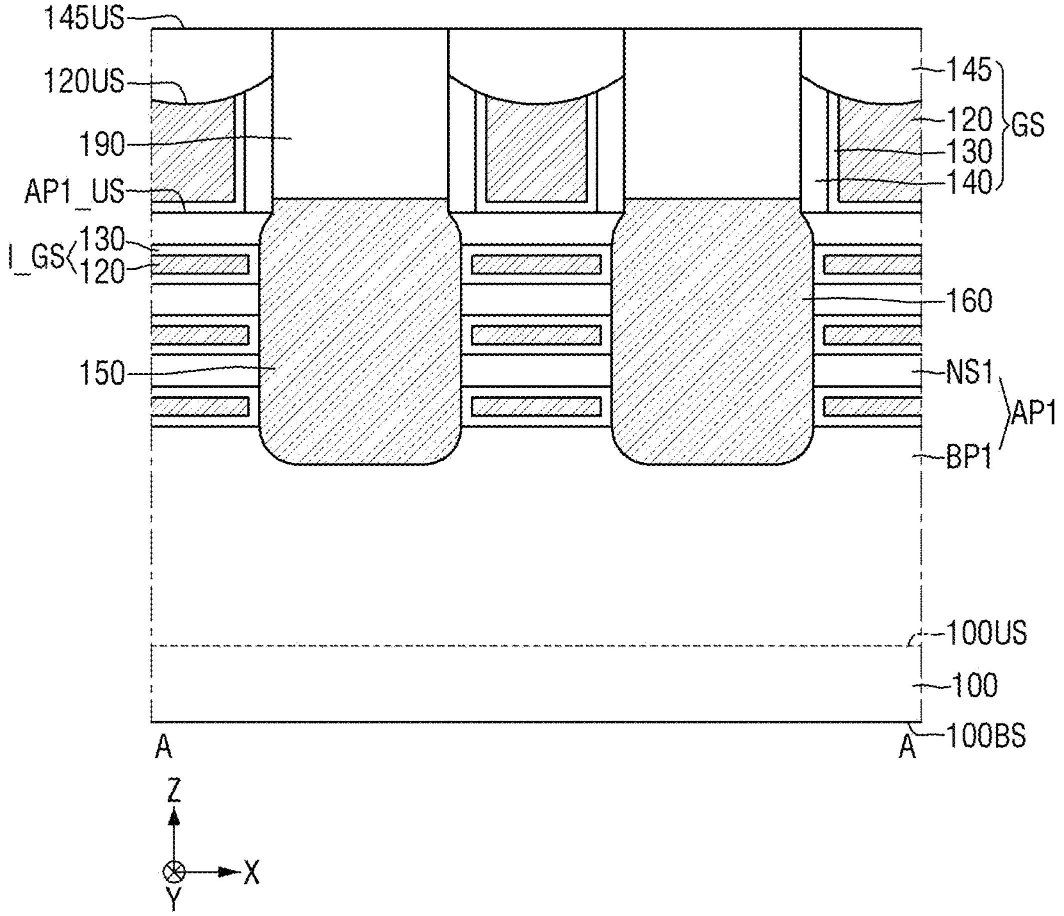
FIGS. 27 to 33 are intermediate operation views for describing a method for manufacturing a semiconductor device according to some example embodiments.

Referring to FIG. 27, the first source/drain pattern 150 and the second source/drain pattern 160 are formed on the first lower pattern BP1 on a substrate 100.

The substrate 100 may include an upper surface 100US and a lower surface 100BS that are opposite to each other in the third direction Z. The substrate 100 may be bulk silicon or silicon-on-insulator (SOI). Unlike this, the substrate 100 may be a silicon substrate, and may include another material, for example, silicon germanium, silicon germanium on insulator (SGOI), indium antimonide, lead tellurium compound, indium arsenide, indium phosphide, gallium arsenide, or gallium antimonide, but is not limited thereto.

The first active pattern AP1 may be disposed on the upper surface 100US of the substrate. The first lower pattern BP1 may protrude from the upper surface 100US of the substrate in the third direction Z.

Before the first source/drain pattern 150 and the second source/drain pattern 160 are formed, the gate spacer 140 may be formed on the first lower pattern BP1.

The first frontside interlayer insulating film 190 is formed on the first source/drain pattern 150 and the second source/drain pattern 160. Subsequently, the first sheet pattern NS1 is formed on the first lower pattern BP1. Through this, the first active pattern AP1 is formed on the upper surface 100US of the substrate.

Subsequently, the gate insulating film 130 and the gate electrode 120 surrounding the first sheet pattern NS1 may be formed on the first lower pattern BP1. The gate capping pattern 145 may be formed on the gate electrode 120. Through this, the gate structure GS may be formed on the first active pattern AP1. An upper surface 145US of the gate capping pattern may be on the same plane as the upper surface of the first frontside interlayer insulating film 190.

Although not illustrated, the source/drain etch stop film may be further formed between the first frontside interlayer insulating film 190 and the first source/drain pattern 150, and between the first frontside interlayer insulating film 190 and the second source/drain pattern 160.

Figure 28:
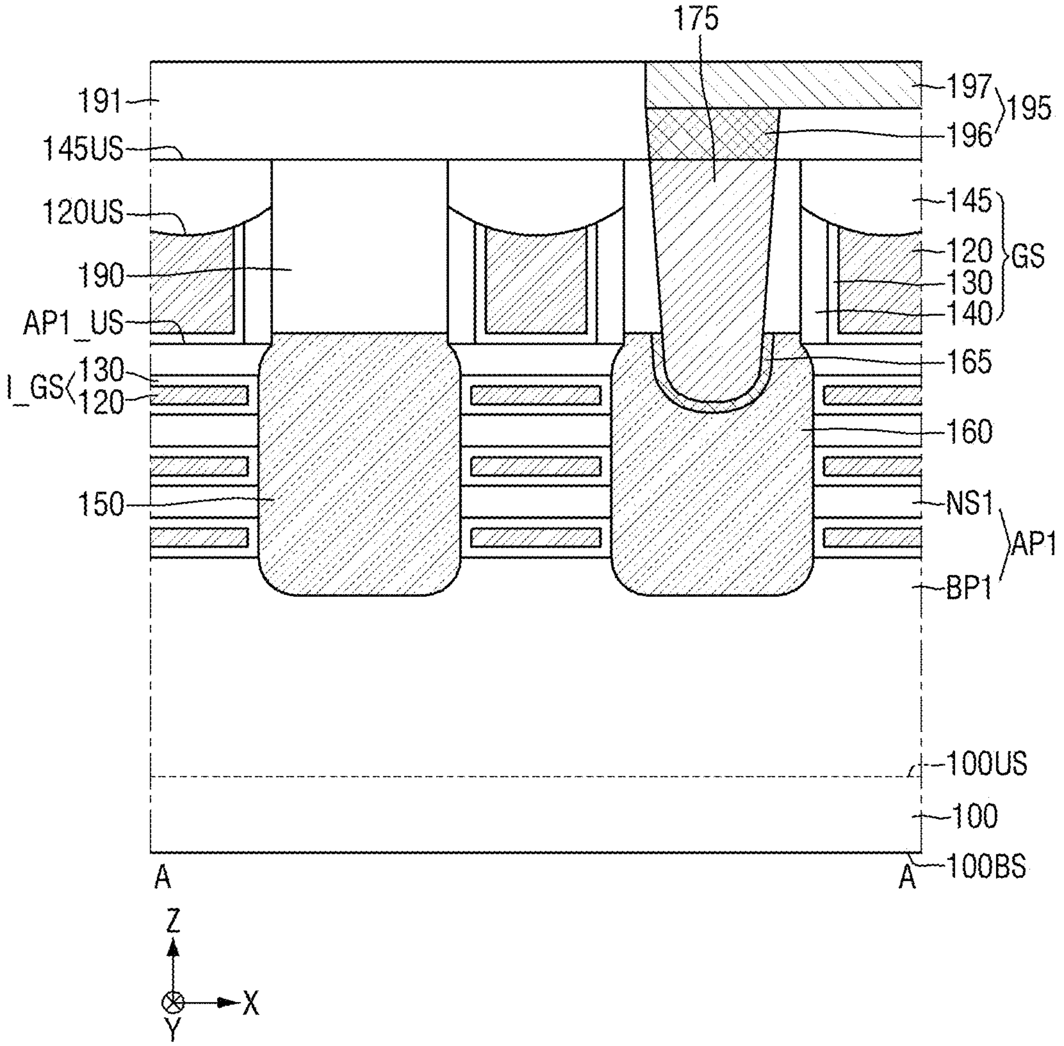

Referring to FIG. 28, the first frontside source/drain contact 175 is formed on the upper surface 100US of the substrate.

The first frontside source/drain contact 175 is connected to the second source/drain pattern 160. Before the first frontside source/drain contact 175 is formed, the second contact silicide film 165 may be formed on the second source/drain pattern 160.

Subsequently, the frontside wiring structure 195 is formed on the gate structure GS and the first frontside source/drain contact 175. The frontside wiring structure 195 may be connected to the first frontside source/drain contact 175.

Figure 29:
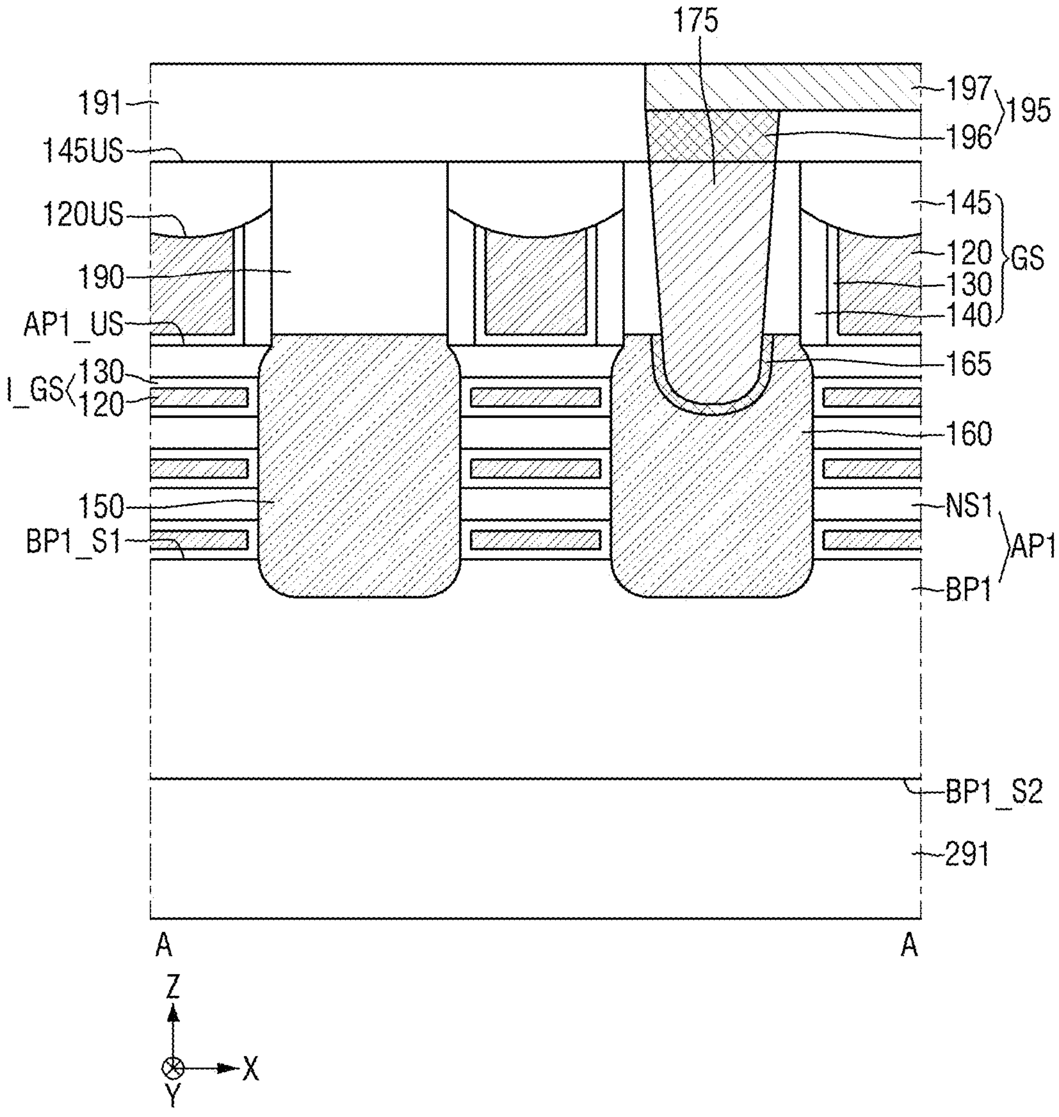

Referring to FIGS. 28 and 29, after forming the frontside wiring structure 195, the substrate 100 may be removed.

The first lower pattern BP1 includes a first surface BP1_S1 and a second surface BP1_S2 that are opposite to each other in the third direction Z. As the substrate 100 is removed, the second surface BP1_S2 of the first lower pattern may be exposed.

Although not illustrated, a thickness of the substrate 100 may be reduced by removing a portion of the substrate 100.

Subsequently, the second backside interlayer insulating film 291 may be formed on the second surface BP1_S2 of the first lower pattern.

Figure 30:
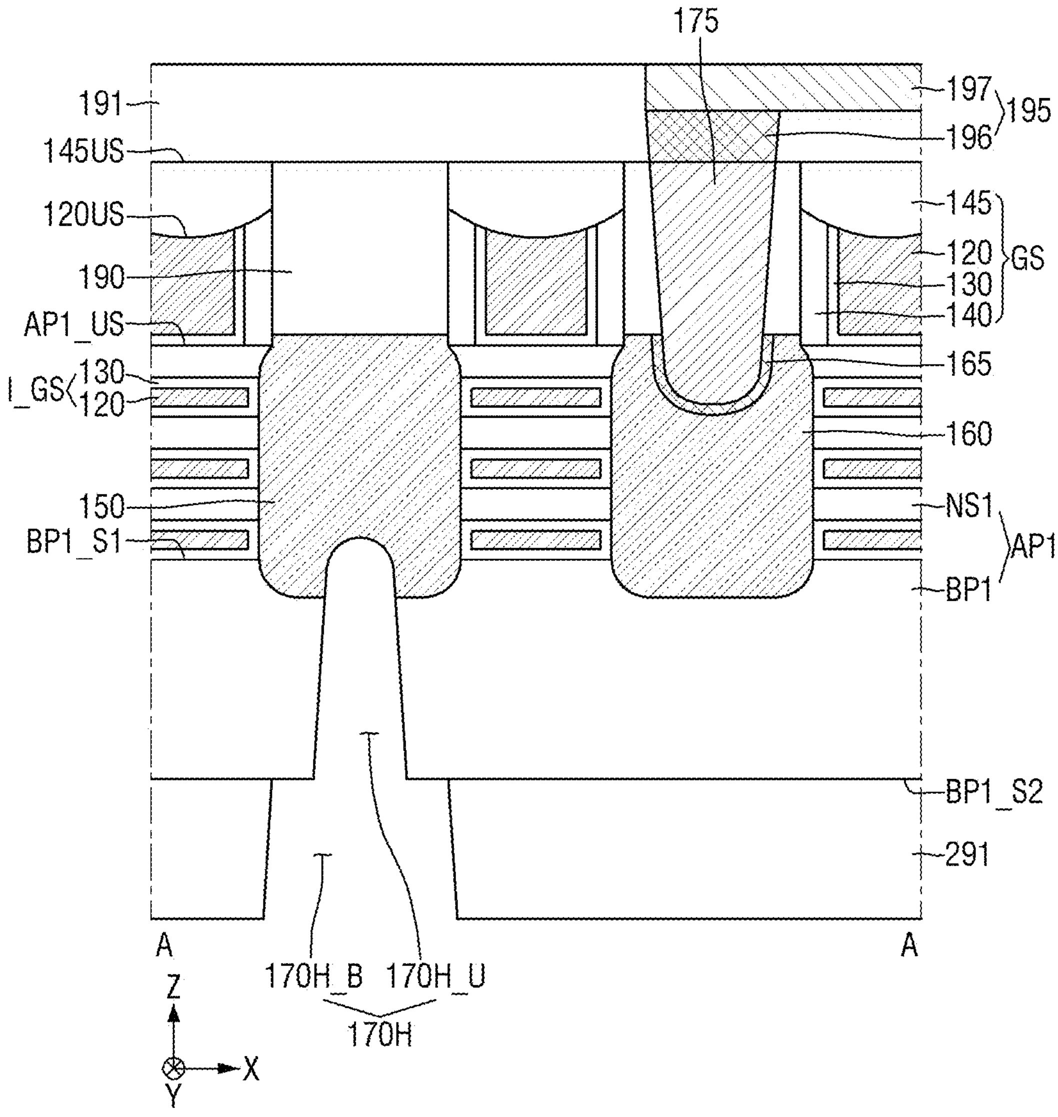

Referring to FIGS. 29 and 30, the backside contact hole 170H may be formed within the second backside interlayer insulating film 291 and the first lower pattern BP1.

The backside contact hole 170H may expose the first source/drain pattern 150. The backside contact hole 170H may include a first backside contact hole 170H_U and a second backside contact hole 170H_B. For example, the first backside contact hole 170H_U may be formed within the first lower pattern BP1 and the first source/drain pattern 150. The second backside contact hole 170H_B may be formed within the second backside interlayer insulating film 291.

Figure 31:
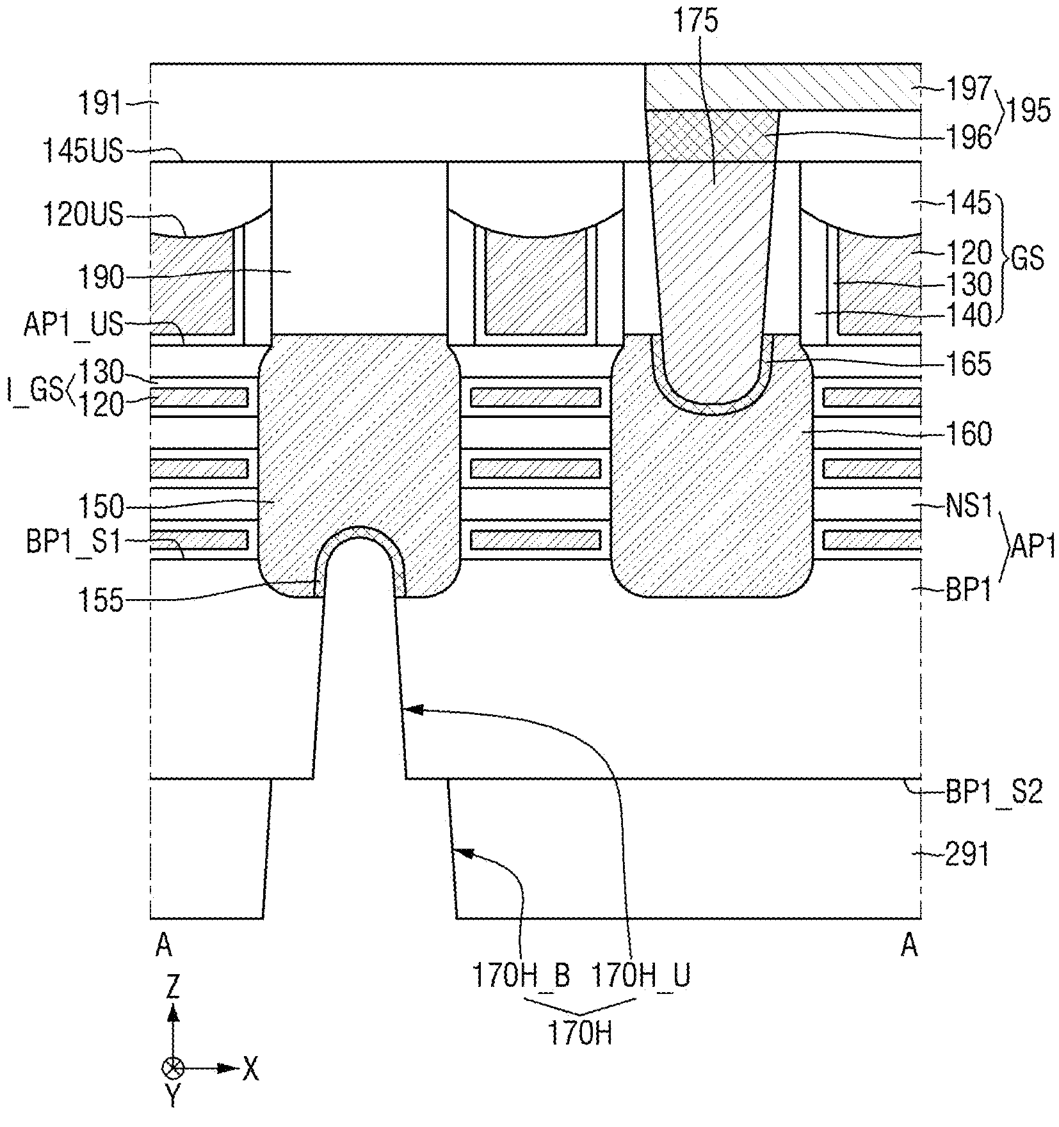

Referring to FIGS. 30 and 31, the first contact silicide film 155 may be formed on the first source/drain pattern 150.

The first contact silicide film 155 may be formed along the first source/drain pattern 150 exposed by the first backside contact hole 170H_U.

Figure 32:
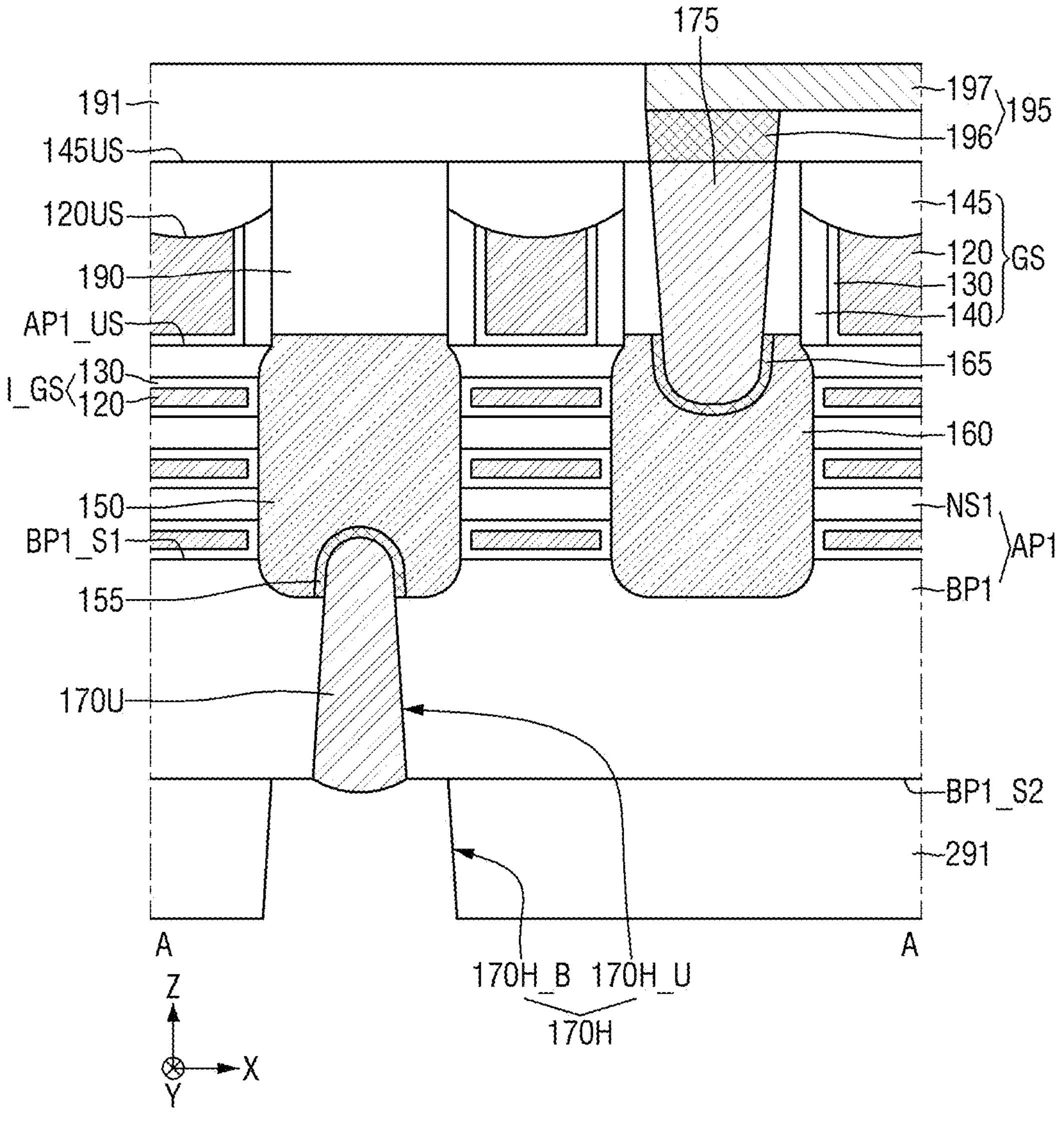

Referring to FIGS. 31 and 32, the upper pattern 170U of the first backside source/drain contact may be formed within the backside contact hole 170H.

For example, the upper pattern 170U of the first backside source/drain contact may be formed within the first backside contact hole 170H_U. The upper pattern 170U of the first backside source/drain contact may fill the first backside contact hole 170H_U. The upper pattern 170U of the first backside source/drain contact is in contact with the first contact silicide film 155.

For example, the upper pattern 170U of the first backside source/drain contact may be formed using a selective growth method. In the selective growth method, the pattern may be selectively formed on a conductive material.

In the method for manufacturing the semiconductor device according to some example embodiments, after the upper pattern 170U of the first backside source/drain contact is formed, a surface treatment process for the upper pattern 170U of the first backside source/drain contact may be additionally performed using a gas containing oxygen or nitrogen.

Figure 33:
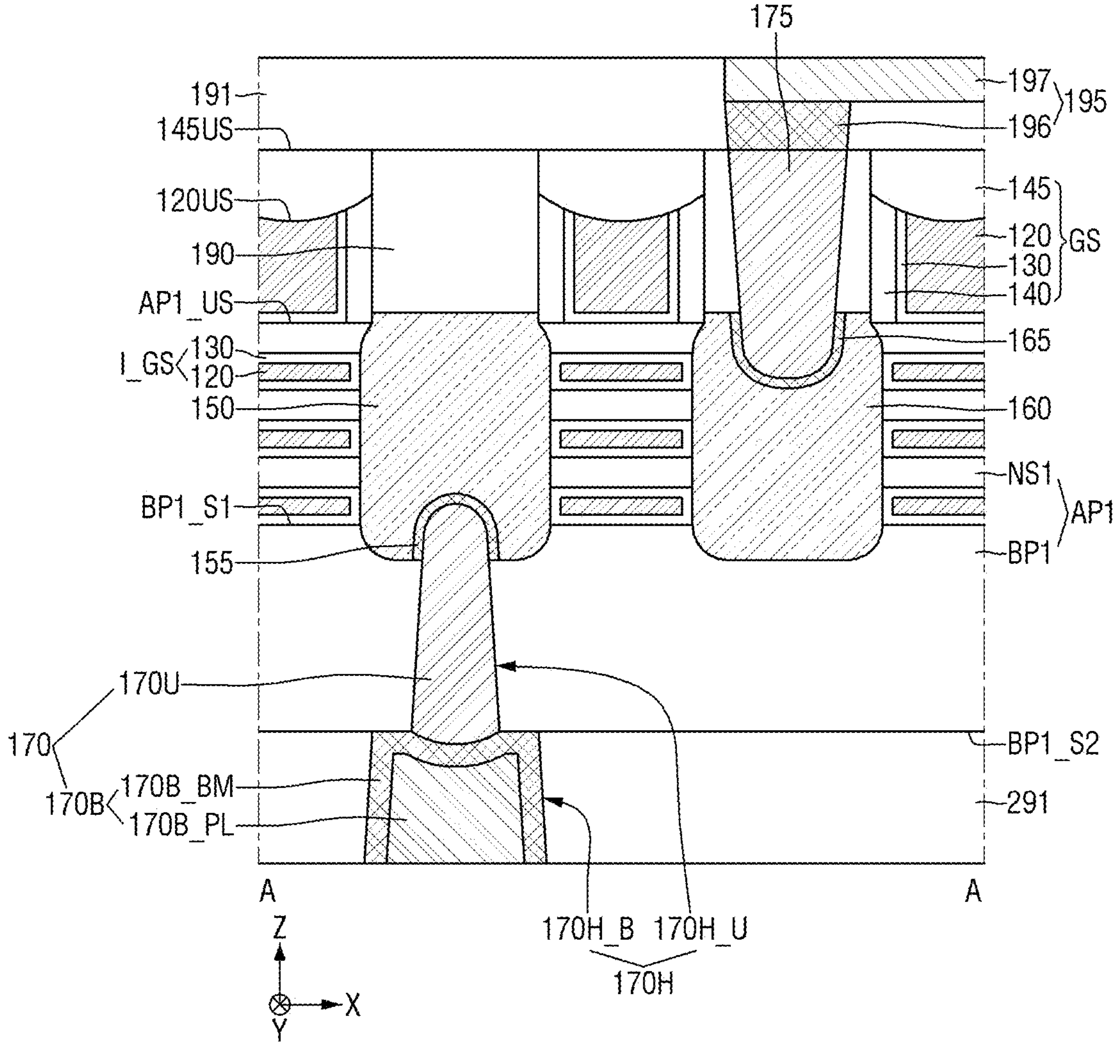

Referring to FIGS. 32 and 33, a lower pattern 170B of the first backside source/drain contact may be formed on the upper pattern 170U of the first backside source/drain contact.

The lower pattern 170B of the first backside source/drain contact may be formed within the backside contact hole 170H. The lower pattern 170B of the first backside source/drain contact may be formed within the second backside contact hole 170H_B. Through this, the first backside source/drain contact 170 may be formed within the backside contact hole 170H.

Subsequently, in FIGS. 2 to 4, the first backside wiring line 50 and the second backside wiring line 60 may be formed on the first backside source/drain contact 170.

In concluding the detailed description, those skilled in the art will appreciate that many variations and modifications may be made to the presented embodiments without departing from the principles of inventive concepts. Therefore, the disclosed presented embodiments provided as non-limiting examples in a descriptive sense only and not for purposes of limitation.

What is claimed is:

1. A semiconductor device comprising:

a first backside interlayer insulating film;

a backside wiring line in the first backside interlayer insulating film, the backside wiring line including a first surface and a second surface opposite each other in a first direction;

a fin-type pattern on the first surface of the backside wiring line, the fin-type pattern extending in a second direction;

a second backside interlayer insulating film between the fin-type pattern and the first backside interlayer insulating film, the fin-type type pattern and the second backside interlayer insulating film defining a backside contact hole, the backside contact hole including a first backside contact hole and a second backside contact hole in fluid communication with each other, the first backside contact hole being in the fin-type pattern on a bottom of the second backside contact hole, and the second backside contact hole being in the second backside interlayer insulating film;

a gate electrode on the fin-type pattern and extending in a third direction;

a first source/drain pattern on a first side of the gate electrode and on the fin-type pattern;

a backside source/drain contact in the backside contact hole on the first surface of the backside wiring line, the backside source/drain contact connecting the backside wiring line and the first source/drain pattern, wherein the backside source/drain contact includes an upper pattern and a lower pattern, the upper pattern of the backside source/drain contact is between the lower pattern of the backside source/drain contact and the first source/drain pattern, the upper pattern of the backside source/drain contact fills at least a portion of the first backside contact hole, and the upper pattern of the backside source/drain contact has a single conductive film structure.

2. The semiconductor device of claim 1, wherein the lower pattern of the backside source/drain contact includes a backside contact liner and a backside contact plug, the backside contact liner is in contact with the upper pattern of the backside source/drain contact and defines a backside liner recess, and the backside contact plug fills the backside liner recess.

3. The semiconductor device of claim 2, wherein the backside contact plug includes a seam pattern.

4. The semiconductor device of claim 2, wherein the upper pattern of the backside source/drain contact and the backside contact plug each include one of molybdenum (Mo), tungsten (W), ruthenium (Ru), cobalt (Co), iridium (Ir), and copper (Cu).

5. The semiconductor device of claim 2, further comprising:
a contact silicide film between the backside source/drain contact and the first source/drain pattern, wherein
the upper pattern of the backside source/drain contact is in contact with the contact silicide film and the fin-type pattern.
6. The semiconductor device of claim 1, wherein
the lower pattern of the backside source/drain contact has a single conductive film structure, and
the lower pattern of the backside source/drain contact fills at least a portion of the second backside contact hole.
7. The semiconductor device of claim 6, wherein the backside source/drain contact further includes a contact capping pattern between the upper pattern of the backside source/drain contact and the lower pattern of the backside source/drain contact.
8. The semiconductor device of claim 1, wherein
an interface between the upper pattern of the backside source/drain contact and the lower pattern of the backside source/drain contact faces the backside wiring line and has a convex shape facing the backside wiring line.
9. The semiconductor device of claim 1, wherein
an interface between the upper pattern of the backside source/drain contact and the lower pattern of the backside source/drain contact faces the backside wiring line and has an inclined shape facing the backside wiring line.
10. The semiconductor device of claim 1, further comprising:
a second source/drain pattern on a second side of the gate electrode on the fin-type pattern, a frontside source/drain contact connected to the second source/drain pattern, and a frontside wiring line connected to the frontside source/drain contact.
11. The semiconductor device of claim 10, further comprising:
a sacrificial epitaxial pattern between the second source/drain pattern and the backside wiring line, wherein
the sacrificial epitaxial pattern is in contact with the second backside interlayer insulating film.
12. The semiconductor device of claim 10, further comprising:
a plurality of sheet patterns disposed on the fin-type pattern, wherein
the plurality of sheet patterns are spaced apart from the fin-type pattern in the first direction, and
the second source/drain pattern is in contact with the plurality of sheet patterns.
13. A semiconductor device comprising:
a first backside interlayer insulating film;
a backside wiring line in the first backside interlayer insulating film, the backside wiring line including a first surface and a second surface opposite each other in a first direction;
a fin-type pattern on the first surface of the backside wiring line, the fin-type pattern extending in a second direction;
a second backside interlayer insulating film between the fin-type pattern and the first backside interlayer insulating film;
a gate electrode on the fin-type pattern and extending in a third direction;
a source/drain pattern on a first side surface of the gate electrode and on the fin-type pattern;
a backside source/drain contact in the second backside interlayer insulating film and the fin-type pattern, the backside source/drain contact connecting the backside wiring line and the source/drain pattern; and
a contact silicide film between the backside source/drain contact and the source/drain pattern, wherein
the backside source/drain contact includes an upper pattern and a lower pattern,
the upper pattern is in contact with the fin-type pattern and the contact silicide film,
the lower pattern is in contact with the second backside interlayer insulating film,
the upper pattern of the backside source/drain contact has a single conductive film structure made of metal, and
an interface between the upper pattern of the backside source/drain contact and the lower pattern of the backside source/drain contact faces the backside wiring line and has either a convex shape or an inclined shape facing the backside wiring line.
14. The semiconductor device of claim 13, wherein
the lower pattern of the backside source/drain contact includes a backside contact liner and a backside contact plug,
the backside contact liner is in contact with the upper pattern of the backside source/drain contact and defines a backside liner recess, and
the backside contact plug fills the backside liner recess.
15. The semiconductor device of claim 13, wherein
the backside source/drain contact further includes a contact capping pattern between the upper pattern of the backside source/drain contact and the lower pattern of the backside source/drain contact, and
the lower pattern of the backside source/drain contact has a single conductive film structure.
16. The semiconductor device of claim 15, wherein
the contact capping pattern includes one of a metal, a metal oxide, and a metal nitride,
the metal oxide is an oxide of a metallic material included in the upper pattern of the backside source/drain contact, and
the metal nitride is a nitride of the metallic material included in the upper pattern of the backside source/drain contact.
17. The semiconductor device of claim 13, wherein
a lower surface of the fin-type pattern includes is in contact with the second backside interlayer insulating film, and
a portion of the upper pattern of the backside source/drain contact protrudes more toward the backside wiring line than the lower surface of the fin-type pattern.
18. The semiconductor device of claim 13, wherein
an upper surface of the second backside interlayer insulating film is in contact with the fin-type pattern, and
a portion of the lower pattern of the backside source/drain contact protrudes more toward the source/drain pattern than the upper surface of the second backside interlayer insulating film.
19. A semiconductor device comprising:
a first backside interlayer insulating film;
a backside wiring line in the first backside interlayer insulating film, the backside wiring line including a first surface and a second surface opposite each other in a first direction;
a fin-type pattern on the first surface of the backside wiring line, the fin-type pattern extending in a second direction;
a second backside interlayer insulating film between the fin-type pattern and the first backside interlayer insulating film, the fin-type type pattern and the second backside interlayer insulating film defining a backside contact hole, the backside contact hole including a first backside contact hole and a second backside contact hole in fluid communication with each other, the first backside contact hole being in the fin-type pattern on a bottom of the second backside contact hole, and the second backside contact hole being in the second backside interlayer insulating film;

a plurality of sheet patterns on the fin-type pattern and spaced apart from the fin-type pattern in the first direction;

a gate electrode on the fin-type pattern, the gate electrode extending in a third direction and surrounding the plurality of sheet patterns;

a source/drain pattern on a side surface of the gate electrode and on the fin-type pattern;

a backside source/drain contact on the first surface of the backside wiring line, the backside source/drain contact connecting the backside wiring line and the source/drain pattern; and a contact silicide film between the backside source/drain contact and the source/drain pattern, wherein the backside source/drain contact includes an upper pattern and a lower pattern, the upper pattern of the backside source/drain contact is in contact with the fin-type pattern and the contact silicide film, the lower pattern of the backside source/drain contact is in contact with the second backside interlayer insulating film, the upper pattern of the backside source/drain contact has a single conductive film structure made of metal, the lower pattern of the backside source/drain contact includes a backside contact liner and a backside contact plug, the backside contact liner and the backside contact plug include a metal, the backside contact liner is in contact with the upper pattern of the backside source/drain contact and the second backside interlayer insulating film, the backside contact line defines a backside liner recess, and the backside contact plug fills the backside liner recess.

20. The semiconductor device of claim 19, wherein an interface between the upper pattern of the backside source/drain contact and the lower pattern of the backside source/drain contact faces the backside wiring line and has either a convex shape or an inclined shape facing the backside wiring line.

* * * * *